United States Patent
Noda et al.

(10) Patent No.: US 9,865,451 B2
(45) Date of Patent: Jan. 9, 2018

(54) CLEANING METHOD, METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takaaki Noda, Toyama (JP); Shingo Nohara, Toyama (JP); Yoshiro Hirose, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 792 days.

(21) Appl. No.: 14/230,356

(22) Filed: Mar. 31, 2014

(65) Prior Publication Data
US 2015/0000695 A1    Jan. 1, 2015

(30) Foreign Application Priority Data

Jun. 28, 2013    (JP) .................................. 2013-137518

(51) Int. Cl.
| | | |
|---|---|---|
| H01L 21/30 | (2006.01) | |
| H01L 21/02 | (2006.01) | |
| C23C 16/44 | (2006.01) | |

(52) U.S. Cl.
CPC .... *H01L 21/02049* (2013.01); *C23C 16/4405* (2013.01); *H01L 21/02126* (2013.01)

(58) Field of Classification Search
None
See application file for complete search history.

(56) References Cited

U.S. PATENT DOCUMENTS

| | | |
|---|---|---|
| 8,673,790 B2 | 3/2014 | Akae et al. |
| 9,054,046 B2 | 6/2015 | Hirose et al. |
| 2006/0054183 A1* | 3/2006 | Nowak ................ B08B 7/0035 134/1.1 |
| 2006/0205191 A1 | 9/2006 | Kashiwagi et al. |

(Continued)

FOREIGN PATENT DOCUMENTS

| | | |
|---|---|---|
| CN | 103165438 A | 6/2013 |
| JP | 10-050686 A | 2/1998 |

(Continued)

OTHER PUBLICATIONS

Chinese Office Action dated Oct. 12, 2015: Foreign Counterpart Application CN 201410139146.4. Reference cited therein has been already identified in a prior IDS.

(Continued)

*Primary Examiner* — Michael Kornakov
*Assistant Examiner* — Ryan Coleman
(74) *Attorney, Agent, or Firm* — Volpe and Koenig, P.C.

(57) ABSTRACT

A method for cleaning an interior of a process chamber after performing a process of forming a carbon-containing film on a substrate in the process chamber includes performing a cycle a predetermined number of times. The cycle includes supplying a modifying gas into the process chamber to modify deposits including the carbon-containing film deposited on a surface of a member in the process chamber and supplying an etching gas into the process chamber to remove the modified deposits through a thermochemical reaction.

16 Claims, 13 Drawing Sheets

(56) References Cited

U.S. PATENT DOCUMENTS

| | | | |
|---|---|---|---|
| 2007/0107660 A9* | 5/2007 | Sen | H01L 21/67103 118/715 |
| 2011/0059600 A1 | 3/2011 | Sakai et al. | |
| 2011/0318937 A1* | 12/2011 | Akae | C23C 16/4405 438/758 |
| 2013/0017685 A1 | 1/2013 | Akae et al. | |
| 2013/0149873 A1 | 6/2013 | Hirose et al. | |

FOREIGN PATENT DOCUMENTS

| | | |
|---|---|---|
| JP | 2002-217166 A | 8/2002 |
| JP | 2011-068984 A | 4/2011 |
| JP | 2012-019194 A | 1/2012 |
| KR | 10-2013-0065606 A | 6/2013 |
| TW | 200627511 | 8/2006 |
| TW | 201205674 A1 | 2/2012 |
| WO | 2005/045916 A1 | 5/2005 |
| WO | 2006/026370 A2 | 3/2006 |
| WO | 2011/111498 A1 | 9/2011 |

OTHER PUBLICATIONS

Japanese Office Action dated Mar. 14, 2017, in the Japanese Application No. 2013-137518.

* cited by examiner

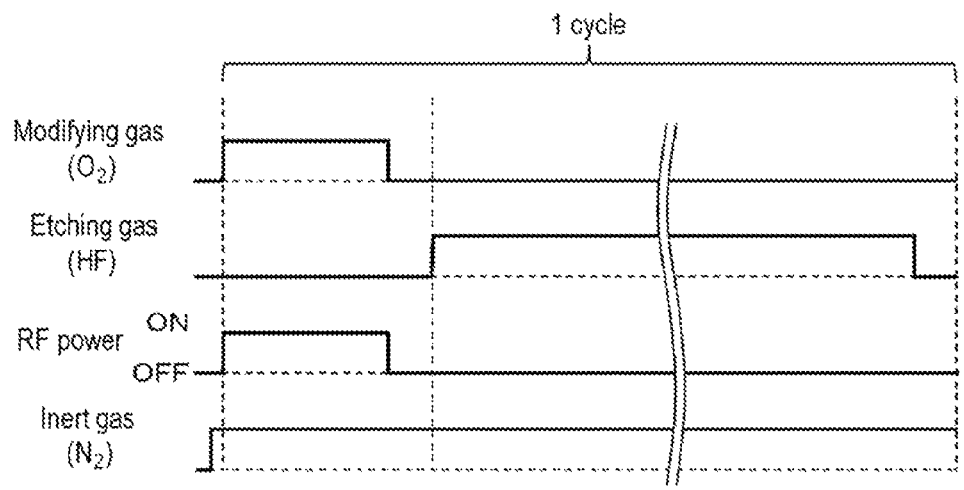
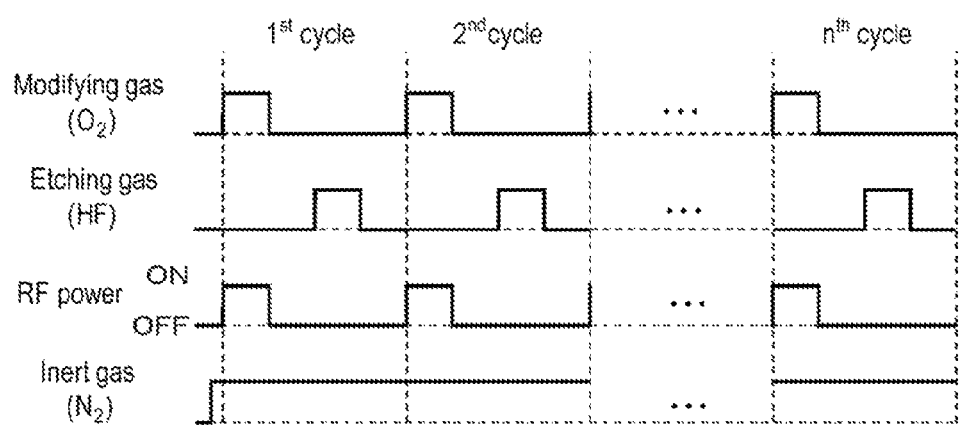

FIG. 12F

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

CLEANING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-137518, filed on Jun. 28, 2013, the entire contents of which are incorporated herein by reference.

TECHNICAL FIELD

The present disclosure relates to a cleaning method, a method of manufacturing a semiconductor device, a substrate processing apparatus, and a recording medium.

BACKGROUND

Manufacturing a semiconductor device includes a process of forming a thin film on a substrate and a process of cleaning the interior of a process chamber, after forming the thin film, by supplying an etching gas such as a fluorine-containing gas, for example, into the process chamber. By the cleaning process, residual deposits (including the same type of film to that formed on the substrate) deposited in the process chamber when forming the thin film on the substrate are removed.

When the thin film formed on the substrate is, for example, a carbon-containing film containing carbon (C), such thin film shows an enhanced film quality, such as an enhanced resistance to wet etching. In this case, residual deposits deposited in the process chamber also include the carbon-containing film.

The residual deposits including the carbon-containing film, which has a high etching resistance, also show a high resistance to a fluorine-containing gas. Thus, the cleaning efficiency is lowered, and in some cases, the residual deposits are not completely removed during the cleaning process.

SUMMARY

The present disclosure provides some embodiments of a cleaning method capable of effectively removing deposits including a carbon-containing film deposited in a process chamber, a method of manufacturing a semiconductor device, a substrate processing apparatus, and a recording medium.

According to an aspect of the present disclosure, there is provided a method for cleaning an interior of a process chamber after performing a process of forming a carbon-containing film on a substrate in the process chamber, by performing a cycle a predetermined number of times, the cycle including: supplying a modifying gas into the process chamber to modify deposits including the carbon-containing film deposited on a surface of a member in the process chamber and supplying an etching gas into the process chamber to remove the modified deposits through a thermochemical reaction.

According to another aspect of the present disclosure, there is provided a method of manufacturing a semiconductor device, including: performing a process of forming a carbon-containing film on a substrate in a process chamber; and cleaning an interior of the process chamber after performing the process of forming the carbon-containing film; wherein the act of cleaning the interior of the process chamber includes performing a cycle a predetermined number of times, the cycle including: supplying a modifying gas into the process chamber to modify deposits including the carbon-containing film deposited on the surface of a member in the process chamber; and supplying an etching gas into the process chamber to remove the modified deposits through a thermochemical reaction.

According to still another aspect of the present disclosure, there is provided a substrate processing apparatus, including: a process chamber configured to perform a process of forming a carbon-containing film on a substrate; a modifying gas supply system configured to supply a modifying gas into the process chamber; an etching gas supply system configured to supply an etching gas into the process chamber; and a control unit configured to control, in the event of cleaning an interior of the process chamber after performing the process of forming the carbon-containing film on a substrate in the process chamber, the modifying gas supply system and the etching gas supply system to perform a cycle a predetermined number of times, the cycle including: supplying the modifying gas into the process chamber to modify deposits including the carbon-containing film deposited on the surface of a member in the process chamber; and supplying the etching gas into the process chamber to remove the modified deposits through a thermochemical reaction.

According to still another aspect of the present disclosure, there is provided a non-transitory computer-readable recording medium storing a program that causes a computer to perform a process of cleaning an interior of a process chamber after performing a process of forming a carbon-containing film on a substrate in the process chamber, by performing a cycle a predetermined number of times, the cycle including: supplying a modifying gas into the process chamber to modify deposits including the carbon-containing film deposited on a surface of a member in the process chamber and supplying an etching gas into the process chamber to remove the modified deposits through a thermochemical reaction.

BRIEF DESCRIPTION OF THE DRAWINGS

FIGS. 6A and 6B are views illustrating catalytic reactions in the film forming sequence according to the first embodiment of the present disclosure, FIG. 6A being a view illustrating Step 1a and FIG. 6B being a view illustrating Step 2a.

FIG. 8A is a view illustrating timings of gas supply and RF power supply in the cleaning sequence according to the first embodiment of the present disclosure, and FIG. 8B is a view illustrating a modification thereof.

FIG. 12F is a view illustrating names, chemical composition formulas, chemical structural formulas, and acid dissociation constants of various amines used as a catalytic gas.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

<First Embodiment>

Hereinafter, a first embodiment of the present disclosure will now be described with reference to the drawings.

(1) Overall Configuration of Substrate Processing Apparatus

Figure 1:
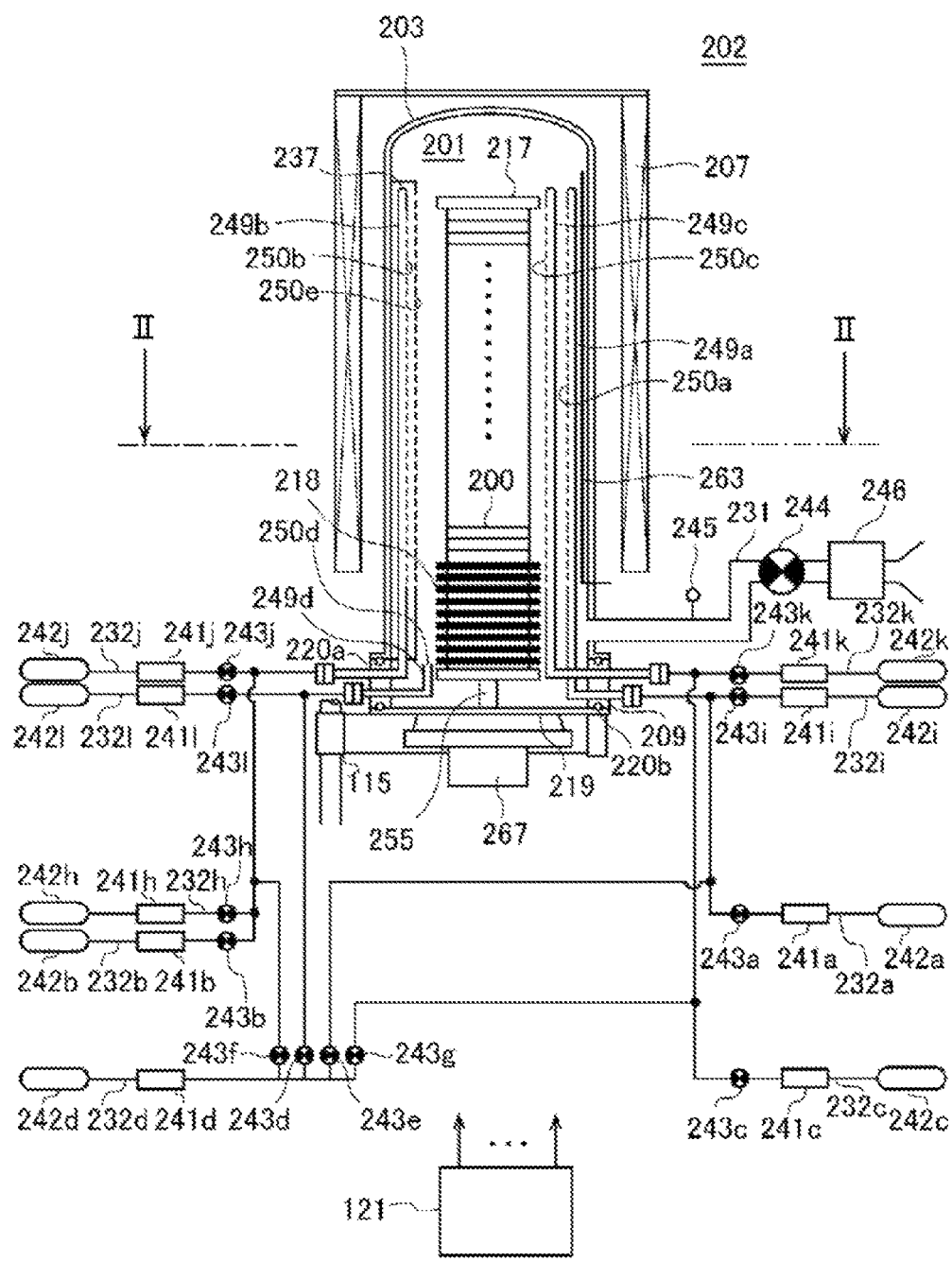
FIG. 1 is a schematic view illustrating a configuration of a vertical processing furnace of a substrate processing apparatus appropriately used in a first embodiment of the present disclosure, the processing furnace being shown in a longitudinal sectional view.

As shown in FIG. 1, the processing furnace 202 includes a heater 207 as a heating unit (heating mechanism). The heater 207 has a cylindrical shape and is supported by a heater base (not shown) as a support plate so as to be vertically installed. The heater 207 also acts as an activating mechanism (exciting unit) to activate (excite) gas by heat.

A reaction tube 203 is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is disposed below the reaction tube 203 in a concentric form along the reaction tube 203. The manifold 209 is made of, for example, metal such as stainless steel, and is formed in a cylindrical shape with its upper and lower ends opened. The upper end of the manifold 209 is caught and coupled to the lower end of the reaction tube 203 and is configured to support the reaction tube 203. In addition, an O-ring 220a as a seal member is installed between the manifold 209 and the reaction tube 203. As the manifold 209 is supported by the heater base, the reaction tube 203 is in a vertical installation state. Mostly, a process vessel (reaction vessel) is configured with the reaction tube 203 and the manifold 209. A process chamber 201 is defined in a hollow cylindrical portion of the process vessel. The process chamber 201 is configured to accommodate a plurality of wafers 200 as substrates. The wafers 200 are horizontally stacked in multiple stages to be aligned in a vertical direction in a boat 217, which will be described later.

Nozzles 249a to 249d are installed in the process chamber 201 to penetrate through a sidewall of the manifold 209. The nozzles 249a to 249d are connected to gas supply pipes 232a to 232d, respectively. The gas supply pipe 232d is branched at a downstream side, and is also connected to each of the gas supply pipes 232a to 232c at downstream ends of the branches. A gas supply pipe 232h is connected to the gas supply pipe 232b. In this way, the four nozzles 249a to 249d and the plurality of gas supply pipes 232a to 232d and 232h are installed at the reaction tube 203, and thus, a plurality of types of gases can be supplied into the process chamber 201.

An $(SiCl_3)_2CH_2$ (BTCSM) gas supply source 242a, which is a precursor gas supply source, for example, is connected to an upstream end of the gas supply pipe 232a. An $H_2O$ gas supply source 242b, which is an oxidizing gas supply source, for example, is connected to an upstream end of the gas supply pipe 232b. An $O_2$ gas supply source 242h, which is a modifying gas supply source, for example, is connected to an upstream end of the gas supply pipe 232h. A $C_5H_5N$ (pyridine) gas supply source 242c, which is a catalytic gas supply source, for example, is connected to an upstream end of the gas supply pipe 232c. $N_2$ gas supply sources 242i to 242k, which are inert gas supply sources, for example, are connected to upstream ends of the gas supply pipes 232i to 232k, which are connected to the gas supply pipes 232a to 232c, respectively. MFCs (Mass flow controllers) 241a to 241c and 241i to 241k, which are flow rate controllers (flow rate control parts), and valves 243a to 243c and 243i to 243k, which are opening/closing valves, for example, are respectively installed in the gas supply pipes 232a to 232c and 232i to 232k in this order from an upstream direction where the respective gas supply sources 242a to 242c and 242i to 242k are connected. The branched downstream ends of the gas supply pipe 232d to be described later and the downstream ends of the gas supply pipes 232i to 232k are connected to the gas supply pipes 232a to 232c at downstream sides of the valves 243a to 243c, respectively. A downstream end of the gas supply pipe 232h is connected to the gas supply pipe 232b at a downstream side of the valve 243b.

An HF gas supply source 242d, which is an etching gas supply source, for example, is connected to an upstream end of the gas supply pipe 232d. An MFC 241d is installed in the gas supply pipe 232d. The gas supply pipe 232d is branched into four at a downstream side of the MFC 241d, and valves 243d to 243g, which are opening/closing valves, are installed in the respective branches. Downstream ends of the three branches of the gas supply pipe 232d, in which the valves 243e to 243g are respectively installed, are connected to the gas supply pipes 232a to 232c, respectively. A downstream end of the gas supply pipe 232l is connected to the remaining one branch of the gas supply pipe 232d at a downstream side of valve 243d. An $N_2$ gas supply source 242l, which is an inert gas supply source, for example, is connected to an upstream end of the gas supply pipe 232l. An MFC 241l, which is a flow rate controller (a flow rate control part), and a valve 243l, which is an opening/closing valve, are respectively installed in the gas supply pipe 232l in this order from an upstream direction where the $N_2$ gas supply source 242l is connected.

Figure 2:
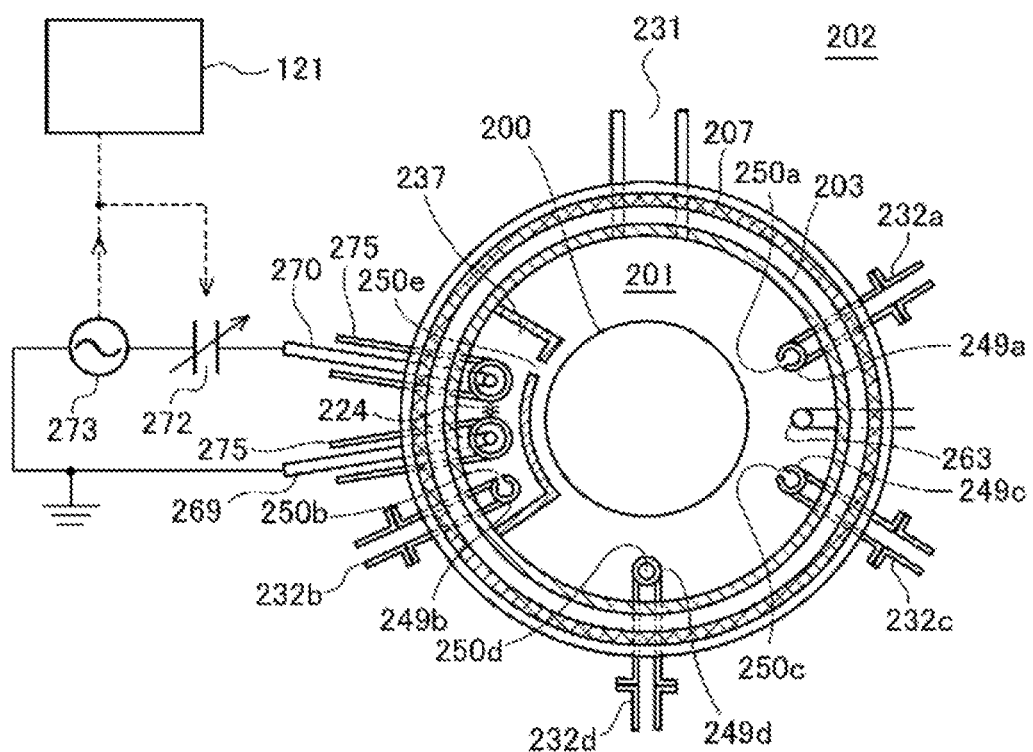
FIG. 2 is a schematic view illustrating a configuration of the vertical processing furnace of the substrate processing apparatus appropriately used in the first embodiment of the present disclosure, the processing furnace being shown in a sectional view taken along line II-II in FIG. 1.

The above-described nozzles 249a and 249c are connected to leading end portions of the gas supply pipes 232a and 232c, respectively. As shown in FIG. 2, the nozzles 249a and 249c are respectively installed in an annular space between the inner wall of the reaction tube 203 and the wafers 200. The nozzles 249a and 249c are vertically disposed along the inner wall of the reaction tube 203 to rise upward in the stacking direction of the wafers 200. That is, the nozzles 249a and 249c are respectively installed along a wafer arrangement region, in which the wafers 200 are arranged. More specifically, the nozzles 249a and 249c are respectively installed in a region which is disposed at the side of the wafer arrangement region and horizontally surrounds the wafer arrangement region. The nozzles 249a and 249c are respectively configured as L-shaped long nozzles, and have their respective horizontal portions installed to penetrate through the sidewall of the manifold 209 and their respective vertical portions installed to rise from at least one end portion of the wafer arrangement region toward the other end portion thereof. A plurality of gas supply holes 250a and 250c through which the gas is supplied are formed in side surfaces of the nozzles 249a and 249c, respectively. As shown in FIG. 2, the gas supply holes 250a and 250c are opened toward the center of the reaction tube 203 to supply gas toward the wafers 200. The plurality of the gas supply holes 250a and 250c is disposed at a predetermined opening pitch from the lower portion to the upper portion of the reaction tube 203. Each of the plurality of gas supply holes 250a and 250c has the same opening area.

The above-described nozzle 249d is connected to a leading end portion of one of the four branches of the gas supply pipe 232d, in which the valve 243d is installed. The nozzle 249d is installed in an annular space between the inner wall of the manifold 209 and a side surface of a base (an arrangement region of a heat insulating plate 218 described later) of the boat 217 supporting the wafers 200. The nozzle 249d is vertically disposed along the inner wall of the manifold 209 to rise upward in the arrangement direction of the heat insulating plate 218. That is, the nozzle 249d is installed along the arrangement region of the heat insulating plate 218. More specifically, the nozzle 249d is installed in a region which is disposed below the wafer arrangement region where the wafers are arranged and horizontally surrounds the base of the boat 217. The nozzle 249d is configured as an L-shaped short nozzle, and has its horizontal portion installed to penetrate through the sidewall of the manifold 209 and its vertical portion installed to rise from at least lower portion of the arrangement region of the heat insulating plate 218 toward an upper portion thereof. A gas supply hole 250d through which gas is supplied is formed in a leading end portion of the nozzles 249d. As shown in FIG. 2, the gas supply hole 250d is opened toward the upper side of the reaction tube 203 to supply gas to a region near a furnace port.

The above-described nozzle 249b is connected to a leading end portion of the gas supple pipe 232b. The nozzle 249b is installed inside a buffer chamber 237 that is a gas diffusion space. As shown in FIG. 2, the buffer chamber 237 is installed in an annular space between the inner wall of the reaction tube 203 and the wafers 200. The buffer chamber 237 is vertically disposed along the inner wall of the reaction tube 203 in the stacking direction of the wafers 200. That is, the buffer chamber 237 is installed along a wafer arrangement region, in which the wafers 200 are arranged, from the lower portion to the upper portion of the reaction tube 203. More specifically, the buffer chamber 237 is installed in a region which is disposed at the side of the wafer arrangement region and horizontally surrounds the wafer arrangement region. A plurality of gas supply holes 250e through which gas is supplied are formed in an end portion of a wall of the buffer chamber 237 adjacent to the wafers 200. The gas supply holes 250e are opened toward the center of the reaction tube 203 to supply gas toward the wafers 200. The gas supply holes 250e are disposed at a predetermined opening pitch from the lower portion to the upper portion of the reaction tube 203. Each of the gas supply holes 250e has the same opening area.

As shown in FIG. 2, the nozzle 249b is installed along the inner wall of the reaction tube 203 to rise upward in the stacking direction of the wafers 200 in an end portion of the buffer chamber 237 opposite to the end portion thereof in which the gas supply holes 250e is formed. That is, the nozzle 249b is installed in a region, which is disposed at the side of the wafer arrangement region where the wafers 200 are arranged and horizontally surrounds the wafer arrangement region. The nozzle 249b is configured as an L-shaped long nozzle and has its horizontal portion installed to penetrate through the sidewall of the manifold 209 and its vertical portion installed to rise from one end portion of the wafer arrangement region toward the other end portion thereof. A plurality of gas supply holes 250b through which gas is supplied is formed in a side surface of the nozzle 249b. As shown in FIG. 2, the gas supply holes 250b are opened toward the center of the buffer chamber 237. The plurality of gas supply holes 250b are formed from the lower portion to the upper portion of the reaction tube 203 in the same way as the gas supply holes 250e of the buffer chamber 237. The plurality of gas supply holes 250b may have the same opening area and the same opening pitch from an upstream side (lower portion) of the reaction tube 203 to an downstream side (upper portion) of the reaction tube 203 when a pressure difference between the interior of the buffer chamber 237 and the interior of the process chamber 201 is small. However, when the pressure difference is large, the opening area of each gas supply holes 250b may be set larger and the opening pitch of each gas supply holes 250b may be set smaller at the downstream side than the upstream side of the reaction tube 203.

In the embodiment, by adjusting the opening area or opening pitch of each gas supply holes 250b from the upstream side to the downstream side as described above, gases may be ejected at an almost same flow rate from the respective gas supply holes 250b despite a flow velocity difference. In addition, the gases ejected from the respective gas supply holes 250b are first introduced into the buffer chamber 237, and flow velocities of the gases become uniform in the buffer chamber 237. That is, the gases ejected from the respective gas supply holes 250b into the buffer chamber 237 are mitigated in particle velocity of the respective gases in the buffer chamber 237, and then are ejected from the respective gas supply holes 250e into the process chamber 201. Therefore, the gases ejected from the respective gas supply holes 250b into the buffer chamber 237 have a uniform flow rate and flow velocity when the gases are ejected from the respective gas supply holes 250e into the process chamber 201.

In the method of supplying gas according to the embodiment using at least long nozzles such as the nozzles 249a to 249c, the gas may be transferred through the nozzles 249a to 249c and the buffer chamber 237 disposed in an annular longitudinally extended space, i.e., cylindrical space, defined by the inner wall of the reaction tube 203 and end portions of the stacked wafers 200. The gas is first ejected into the reaction tube 203 near the wafers 200 through the gas supply holes 250a to 250c and 250e opened in the nozzles 249a to 249c and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, the film thickness of a film formed on the surface of each of the wafers 200 can be uniform. A residual gas after the reaction flows toward an exhaust port, i.e., the exhaust pipe 231, but a flow direction of the residual gas is not limited to the vertical direction but may be appropriately adjusted by a position of the exhaust port.

A chlorosilane-based precursor gas containing a methylene group, for example, which is a precursor gas containing Si, a methylene group as an alkylene group and a chloro group as a halogen group, as a precursor gas containing silicon (Si), carbon (C) and a halogen element (fluorine (F), chlorine (Cl), bromine (Br) or the like) and having an Si—C bonding, is supplied from the precursor gas supply pipe 232a into the process chamber 201 through the MFC 241a, the valve 243a and the nozzle 249a. The chlorosilane-based precursor gas containing a methylene group is a silane-based precursor gas containing a methylene group and a chloro group, or a precursor gas at least containing Si, a methylene group containing C, and Cl as a halogen element. The chlorosilane-based precursor gas containing a methylene group supplied from the precursor gas supply pipe 232a may include, for example, methylenebis(trichlorosilane) gas, i.e., bis(trichlorosilyl)methane [(SiCl$_3$)$_2$CH$_2$, abbreviation: BTCSM] gas.

Figure 12A:
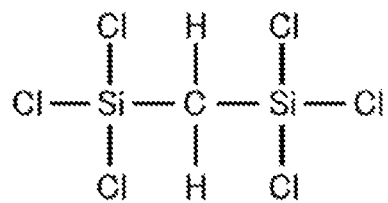
FIGS. 12A to 12E are views illustrating chemical structural formulas of various silanes used as a precursor gas, FIGS. 12A to 12E showing chemical structural formulas of BTCSM, BTCSE, TCDMDS, DCTMDS and MCPMDS, respectively.

As shown in FIG. 12A, the BTCSM contains a methylene group as an alkylene group in its chemical structural formula (In one molecule). The methylene group contained in the BTCSM has two bonding electrons each bonded to Si to form an Si—C—Si bonding. The Si—C bonding contained in the precursor gas is a part of the Si—C—Si bonding, for example, contained in the BTCSM, and the methylene group contained in the BTCSM contains C constituting the Si—C bonding.

Also, the precursor gas containing Si, C and a halogen element and having an Si—C bonding includes, for example, a chlorosilane-based precursor gas containing an ethylene group, which is a precursor gas containing Si, an ethylene group as an alkylene group, and a chloro group as a halogen group. The chlorosilane-based precursor gas containing an ethylene group may include, for example, ethylenebis(trichlorosilane) gas, i.e., 1,2-bis(trichlorosilyl)ethane [(SiCl$_3$)$_2$C$_2$H$_4$, abbreviation: BTCSE] gas or the like.

Figure 12B:
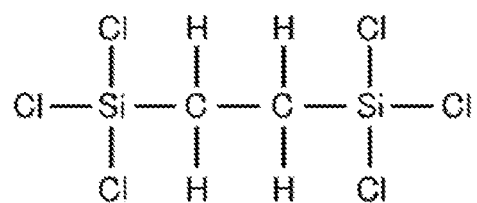

As shown in FIG. 12B, the BTCSE contains an ethylene group as an alkylene group in its chemical structural formula (In one molecule). The ethylene group contained in the BTCSE has two bonding electrons each bonded to Si to form an Si—C—C—Si bonding. The Si—C bonding contained in the precursor gas is a part of the Si—C—C—Si bonding, for example, contained in the BTCSE, and the ethylene group contained in the BTCSE contains C constituting the Si—C bonding.

Here, the alkylene group is a functional group in which two hydrogen (H) atoms are removed from a chain-like saturated hydrocarbon (alkane) represented by a general formula $C_nH_{2n+2}$, and is an assembly of atoms represented by a general formula $C_nH_{2n}$. The alkylene group includes a propylene group, a butylene group, or the like, in addition to the methylene group or the ethylene group described above as an example. As described above, the precursor gas containing Si, C and a halogen element and having an Si—C bonding includes an alkylenehalosilane-based precursor gas containing Si, an alkylene group and a halogen element. The alkylenehalosilane-based precursor gas is a halosilane-based precursor gas containing an alkylene group, and may be referred to as a gas having, for example, a structure in which an alkylene group is introduced between bonded Si and Si in a halosilane-based precursor gas while many halogen elements are bonded to bonding electrons of Si. The alkylenehalosilane-based precursor gas includes the BTCSM gas, the BTCSE gas, and the like.

Moreover, a precursor gas containing Si, C and a halogen element and having an Si—C bonding may include a chlorosilane-based precursor gas containing a methyl group, for example, which is a precursor gas containing Si, a methyl group as an alkyl group, and a chloro group as a halogen group. Here, the chlorosilane-based precursor gas containing a methyl group is a silane-based precursor gas containing a methyl group and a chloro group, or a precursor gas at least containing Si, a methyl group containing C, and Cl as a halogen element. The chlorosilane-based precursor gas containing a methyl group may include, for example, 1,1,2,2-tetrachloro-1,2-dimethyldisilane [(CH$_3$)$_2$Si$_2$Cl$_4$, abbreviation: TCDMDS] gas, a 1,2-dichloro-1,1,2,2-tetramethyldisilane [(CH$_3$)$_4$Si$_2$Cl$_2$, abbreviation: DCTMDS] gas, a 1-monochloro-1,1,2,2,2-pentamethyldisilane [(CH$_3$)$_5$Si$_2$Cl, abbreviation: MCPMDS] gas, or the like.

Figure 12C:
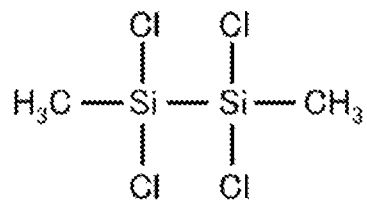

As shown in FIG. 12C, the TCDMDS contains two methyl groups as alkyl groups in its chemical structural formula (In one molecule). The two methyl groups contained in the TCDMDS have bonding electrons each bonded to Si to form an Si—C bonding. The Si—C bonding contained in the precursor gas is, for example, the Si—C bonding contained in the TCDMDS, and each of the two methyl groups contained in the TCDMDS contains C constituting the Si—C bonding.

Figure 12D:
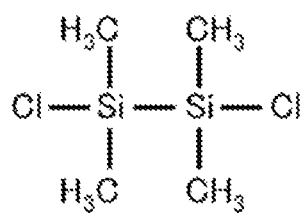

As shown in FIG. 12D, the DCTMDS contains four methyl groups as alkyl groups in its chemical structural formula (In one molecule). The four methyl groups contained in the DCTMDS have bonding electrons each bonded to Si to form an Si—C bonding. The Si—C bonding contained in the precursor gas is, for example, the Si—C bonding contained in the DCTMDS, and each of the four methyl groups contained in the DCTMDS contains C constituting the Si—C bonding.

Figure 12E:
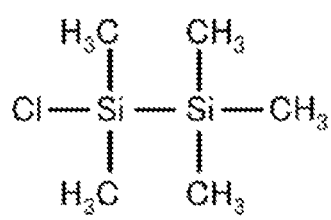

As illustrated in FIG. 12E, MCPMDS contains five methyl groups as alkyl groups in its chemical structural formula (In one molecule). The five methyl groups contained in the MCPMD having bonding electrons each bonded to Si to form an Si—C bonding. The Si—C bonding contained in the precursor gas is, for example, a portion of the Si—C bonding contained in the MCPMDS, and each of the five methyl groups contained in the MCPMDS contains C constituting the Si—C bonding. Unlike the precursor gases such as the BTCSM gas, the BTCSE gas, the TCDMDS gas, the DCTMDS gas or the like as described above, the MCPMDS gas has an asymmetry structure in which the methyl groups and the chloro groups surrounding Si are asymmetrically arranged in the MCPMDS molecules (in its chemical structural formula). As such, in this embodiment, a precursor gas having an asymmetrical chemical structural formula, as well as the precursor gases having a symmetrical chemical structural formula as shown in FIGS. 12A to 12D, may also be used.

Here, the alkyl group is a functional group in which one H atom is removed from a chain-like saturated hydrocarbon (alkane) represented by a general formula $C_nH_{2n+2}$, and is an assembly of atoms represented by a general formula $C_nH_{2n+1}$. The alkyl group includes an ethyl group, a propyl group, a butyl group, and the like, in addition to the methyl group described above as an example. As described above, the precursor gas containing Si, C and a halogen element and having an Si—C bonding includes an alkylhalosilane-based precursor gas containing Si, an alkyl group and a halogen element. The alkylhalosilane-based precursor gas is a halosilane-based precursor gas containing an alkyl group, and may also be referred to as a gas having a structure in which some halogen groups of a halosilane-based precursor gas are substituted by alkyl groups. The alkylhalosilane-based precursor gas includes the TCDMDS gas, the DCTMDS gas, the MCPMDS gas, and the like.

The BTCSM gas, the BTCSE gas, the TCDMDS gas, the DCTMDS gas, and the MCPMDS gas may be precursor gases containing C, a halogen element (Cl) and at least two Si atoms and having at least two Si—C bondings in one molecule. By using these types of precursor gases, as described later, C may be introduced with high concentration into a thin film to be formed.

Here, the precursor gas refers to a precursor in a gaseous state, for example, a gas obtained by vaporizing a precursor that is a liquid state under normal temperature and pressure, a precursor that is gaseous state under normal temperature and pressure, or the like. When the term "precursor" is used herein, it may refer to "a liquid precursor in a liquid state," "a precursor gas in a gaseous state," or both of them. Therefore, when the term "halosilane-based precursor (chlorosilane-based precursor)" is used herein, it may refer to "a halosilane-based precursor (chlorosilane-based precursor) in a liquid state," "a halosilane-based precursor (chlorosilane-based precursor) gas in a gaseous state," or both of them. When a liquid precursor in a liquid state under normal temperature and pressure such as BTCSM, BTCSE, TCDMDS, DCTMDS or MCPMDS is used, the liquid precursor is vaporized by a vaporization system, such as a vaporizer or a bubbler, and supplied as a precursor gas (BTCSM gas, BTCSE gas, TCDMDS gas, DCTMDS gas or MCPMDS gas).

An oxygen-containing gas (O-containing gas) or the like, for example, as an oxidizing gas, is supplied from the oxidizing gas supply pipe 232$b$ into the process chamber 201 through the MFC 241$b$, the valve 243$b$, the nozzle 249$b$, and the buffer chamber 237. The O-containing gas supplied from the oxidizing gas supply pipe 232$b$ may include, for example, water vapor (an $H_2O$ gas). When supplying the $H_2O$ gas, it may be also possible to supply an oxygen ($O_2$) gas and a hydrogen ($H_2$) gas to an external combustion device (not shown) to generate an $H_2O$ gas and supply the generated $H_2O$ gas to the process chamber 201.

An O-containing gas or the like, for example, as a modifying gas, is supplied from the oxidizing gas supply pipe 232$h$ into the process chamber 201 through the MFC 241$h$, the valve 243$h$, the nozzle 249$b$, and the buffer chamber 237. The O-containing gas supplied from the oxidizing gas supply pipe 232$h$ may include, for example, oxygen ($O_2$) gas. The $O_2$ gas as the modifying gas is used in a cleaning process as described later.

A gas containing nitrogen (N) (nitrogen-based gas) having a lone pair of electrons, for example, as a catalytic gas having an acid dissociation constant (hereinafter, also referred to as "pKa") ranging from about 5 to 11, in some embodiments ranging from about 5 to 7, is supplied from the gas supply pipe 232$c$ into the process chamber 201 through the MFC 241$c$, the valve 243$c$, and the nozzle 249$c$. Here, the acid dissociation constant (pKa) is one of indices quantitatively indicating the strength of acid, and denotes an equilibrium constant (Ka) in dissociation reaction emitting hydrogen ions from acid, as a negative common logarithm. The catalytic gas containing N having a lone pair of electrons weakens a bonding strength of an O—H bonding that may exist on the surface of the wafer 200 and in the oxidizing gas such as the $H_2O$ gas through a catalytic action, to thereby promote decomposition of the precursor gas and also promote an oxidation reaction with the $H_2O$ gas. The nitrogen-based gas containing N having a lone pair of electrons may include, for example, an amine-based gas containing amine in which at least one of hydrogen atoms of ammonia ($NH_3$) is substituted with a hydrocarbon group such as an alkyl group, in addition to the $NH_3$ gas. As the catalytic gas supplied from the gas supply pipe 232$c$, for example, a pyridine ($C_5H_5N$) gas as an amine-based gas may be used.

As illustrated in FIG. 12F, various amines used as a catalytic gas include, for example, pyridine ($C_5H_5N$, pKa=5.67), aminopyridine ($C_5H_6N_2$, pKa=6.89), picoline ($C_6H_7N$, pKa=6.07), lutidine ($C_7H_9N$, pKa=6.96), piperazine ($C_4H_{10}N_2$, pKa=9.80), piperidine ($C_5H_{11}N$, pKa=11.12), and the like. The various amines illustrated in FIG. 12F are cyclic amines in which a hydrocarbon group has a cyclic shape. The cyclic amine may be a heterocyclic compound having a cyclic structure configured with a plurality of C and N, i.e., a nitrogen-containing heterocyclic compound. These amine-based gases as a catalytic gas may be amine-based catalytic gases. Meanwhile, the $NH_3$ gas or the like may be a non-amine-based catalytic gas.

Here, the amine-based gas refers to a gas containing amine in a gas state, for example, a gas obtained by vaporizing amine in a liquid state at room temperature under normal pressure, amine in a gas state at room temperature under normal pressure, and the like. When the term "amine" is used herein, it may mean an "amine in a liquid state", an "amine-based gas in a gas state", or both. In a case of using amine in a liquid state at room temperature under normal pressure such as pyridine, aminopyridine, picoline, lutidine, piperazine and piperidine, the amine in a liquid state is vaporized by a vaporization system such as a vaporizer or a bubbler and then supplied as an amine-based gas (pyridine gas, aminopyridine gas, picoline gas, lutidine gas, piperazine gas or piperidine gas).

A fluorine-containing gas (F-containing gas) or the like, for example, as an etching gas, is supplied from the gas supply pipe 232$d$ into the process chamber 201 through the MFC 241$d$, the valve 243$d$ and the nozzle 249$d$. As the F-containing gas supplied from the gas supply pipe 232$d$, for example, a hydrogen fluoride (HF) gas may be used. The HF gas as an etching gas is used during a cleaning process as described later. The etching gas such as the HF gas may be also referred to as a cleaning gas.

The nitrogen ($N_2$) gas as an inert gas, for example, is supplied from the gas supply pipes 232$i$ to 232$l$ into the process chamber 201 through the MFCs 241$i$ to 241$l$, the valves 243$i$ to 243$l$, the gas supply pipes 232$a$ to 232$d$, the nozzles 249$a$ to 249$d$, and the buffer chamber 237, respectively. The $N_2$ gas as the inert gas also acts as a purge gas.

When the above-described gases flow from the respective gas supply pipes, a precursor gas supply system for supplying a precursor gas containing Si, C and a halogen element and having an Si—C bonding is mainly configured by the gas supply pipe 232$a$, the MFC 241$a$ and the valve 243$a$. The nozzle 249$a$ and the BTCSM gas supply source 242$a$ may be included in the precursor gas supply system. The precursor gas supply system may be also referred a precursor supply system.

In addition, an oxidizing gas supply system is mainly configured by the gas supply pipe 232b, the MFC 241b and the valve 243b. The nozzle 249b, the buffer chamber 237 and the H₂O gas supply source 242b may be included in the oxidizing gas supply system.

Further, a modifying gas supply system is mainly configured by the gas supply pipe 232h, the MFC 241h and the valve 243h. The nozzle 249h, the buffer chamber 237 and the O₂ gas supply source 242h may be included in the modifying gas supply system.

An O-containing gas supply system is mainly configured by the oxidizing gas supply system and the modifying gas supply system. That is, the O-containing gas supply system is mainly configured by the gas supply pipes 232b and 232h, the MFCs 241b and 241h, and the valves 243b and 243h. The nozzle 249b, the buffer chamber 237, the H₂O gas supply source 242b and the O₂ gas supply source 242h may be included in the O-containing gas supply system. The O-containing gas supply system may be an aggregation of a plurality of supply lines (supply systems) for supplying a plurality of types of O-containing gases having different molecular structures, respectively. That is, the O-containing gas supply system may be an aggregation of an H₂O gas supply line which is mainly configured by the gas supply pipe 232b, the MFC 241b and the valve 243b, and an O₂ gas supply line which is mainly configured by the gas supply pipe 232h, the MFC 241h and the valve 243h. Here, the nozzle 249b, the buffer chamber 237, or the respective corresponding O-containing gas supply sources 242b and 242h may be included in the individual supply lines.

A catalytic gas supply system is mainly configured by the gas supply pipe 232c, the MFC 241c and the valve 243c. The nozzle 249c and the pyridine gas supply source 242c may be included in the catalytic gas supply system.

An etching gas supply system for supplying an etching gas is mainly configured by the gas supply pipe 232d, the MFC 241d and the valves 243d to 243g. Downstream sides of junctions at which the gas supply pipes 232a to 232c cross with the gas supply pipe 232d, the nozzle 249d and the HF gas supply source 242d may be included in the etching gas supply system. The etching gas supply system may also be referred to as an F-containing gas supply system.

A cleaning gas supply system is mainly configured by the above-described modifying gas supply system (O₂ gas supply line) and the etching gas supply system (F-containing gas supply system).

An inert gas supply system is mainly configured by the gas supply pipes 232i to 232l, the MFCs 241i to 241l, and the valves 243i to 243l. Downstream sides of junctions at which the gas supply pipes 232a to 232d cross with the gas supply pipes 232i to 232l, the nozzles 249a to 249d, the buffer chamber 237, and the N₂ gas supply pipes 242i to 242l may be included in the inert gas supply system. The inert gas supply system also functions as a purge gas supply system.

Also, a plurality of supply lines (supply systems) for supplying a plurality of types of gases having different molecule structures may be installed for the gas supply systems other than the O-containing gas supply system, i.e., the precursor gas supply system, the catalytic gas supply system or the F-containing gas supply system.

In the buffer chamber 237, as illustrated in FIG. 2, two rod-shaped electrodes 269 and 270 made of a conductor and having an elongated structure are disposed to span from the lower portion to the upper portion of the reaction tube 203 in the stacking direction of the wafers 200. Each of the rod-shaped electrodes 269 and 270 is disposed in parallel to the nozzle 249b. Each of the rod-shaped electrodes 269 and 270 is covered with and protected by an electrode protection tube 275 from an upper portion to a lower portion thereof. Any one of the rod-shaped electrodes 269 and 270 is connected to a high-frequency power source 273 through a matching unit 272, and the other one is connected to a ground corresponding to a reference electric potential. By applying high-frequency (RF) power from the high-frequency power source 273 between the rod-shaped electrodes 269 and 270 through the matching unit 272, plasma is generated in a plasma generation region 224 between the rod-shaped electrodes 269 and 270. A plasma source as a plasma generator (plasma generating part) is mainly configured by the rod-shaped electrodes 269 and 270, and the electrode protection tubes 275. The matching unit 272 and the high-frequency power source 273 may also be included in the plasma source. The plasma source functions as an activating mechanism (exciting unit) that activates (excites) gas to a plasma state. In the buffer chamber 237, as illustrated in FIG. 2, two elongated rod-shaped electrodes 269 and 270 made of conductive material are disposed to span from the lower portion to the upper portion of the reaction tube 203 in the stacking direction of the wafers 200. Each of the rod-shaped electrodes 269 and 270 is disposed in parallel to the nozzle 249b. Each of the rod-shaped electrodes 269 and 270 is covered with and protected by an electrode protection tube 275, which is a protection tube for protecting each electrode from an upper portion to a lower portion thereof. Any one of the rod-shaped electrodes 269 and 270 is connected to a high-frequency power source 273 through a matching unit 272, and the other one is connected to a ground corresponding to a reference electric potential. By applying high-frequency (RF) power from the high-frequency power source 273 between the rod-shaped electrodes 269 and 270 through the matching unit 272, plasma is generated in a plasma generation region 224 between the rod-shaped electrodes 269 and 270. A plasma source as a plasma generator (plasma generating part) is mainly configured with the rod-shaped electrodes 269 and 270 and the electrode protection tubes 275. The matching unit 272 and the high-frequency power source 273 may also be included in the plasma source. The plasma source functions as an activating mechanism (exciting part) that activates (excites) gas to plasma.

The electrode protection tube 275 has a structure in which each of the rod-shaped electrodes 269 and 270 can be inserted into the buffer chamber 237 in a state where each of the rod-shaped electrodes 269 and 270 is isolated from an internal atmosphere of the buffer chamber 237. Here, when an internal oxygen concentration of the electrode protection tube 275 is equal to an oxygen concentration in an ambient air (atmosphere), each of the rod-shaped electrodes 269 and 270 inserted into the electrode protection tubes 275 is oxidized by the heat generated by the heater 207. Therefore, by charging the inside of the electrode protection tube 275 with an inert gas such as N₂ gas, or by purging the inside of the electrode protection tube 275 with an inert gas such as N₂ gas using an inert gas purging mechanism, the internal oxygen concentration of the electrode protection tube 275 decreases, thereby preventing oxidation of the rod-shaped electrodes 269 and 270.

The exhaust pipe 231 for exhausting an internal atmosphere of the process chamber 201 is installed at the reaction tube 203. A vacuum pump 246 as a vacuum exhaust device is connected to the exhaust pipe 231 through a pressure sensor 245, which is a pressure detector (pressure detecting part) for detecting an internal pressure of the process chamber 201, and an APC (Auto Pressure Controller) valve 244, which is a pressure adjuster (pressure adjusting part). The APC valve 244 is configured to start/stop vacuum exhaust in the process chamber 201 by opening/closing the valve with the actuated vacuum pump 246, and further to adjust the internal pressure of the process chamber 201 by adjusting a valve opening degree based on pressure information detected by the pressure sensor 245 while operating the vacuum pump 246. An exhaust system is mainly configured by the exhaust pipe 231, the APC valve 244 and the pressure sensor 245. The vacuum pump 246 may also be included in the exhaust system. The exhaust pipe 231 is not limited to being installed at the reaction tube 203 and may be installed at the manifold 209 like the nozzles 249a to 249d.

A seal cap 219, which functions as a furnace port cover configured to hermetically seal a lower end opening of the manifold 209, is installed under the manifold 209. The seal cap 219 is configured to contact the lower end of the manifold 209 from the below in the vertical direction. The seal cap 219, for example, may be formed of metal such as stainless steel and have a disc shape. An O-ring 220b, which is a seal member in contact with the lower end portion of the manifold 209, is installed at an upper surface of the seal cap 219. A rotary mechanism 267 configured to rotate the boat 217 to be described later is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to move vertically by a boat elevator 115, which is an elevation mechanism vertically disposed at the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217 and the wafers 200 supported by the boat 217 into and out of the process chamber 201.

The boat 217, which is used as a substrate support, is made of a heat resistant material such as quartz or silicon carbide and is configured to support a plurality of the wafers 200 horizontally stacked in multiple stages with the centers of the wafers 200 concentrically aligned. Heat insulating plates 218 formed of a heat resistant material such as quartz or silicon carbide are horizontally stacked in multiple stages at a lower portion (corresponding to a base) of the boat 217 and configured such that the heat from the heater 207 cannot be transferred to the seal cap 219. Instead of installing the heat insulating plates 218 at the lower portion of the boat 217, a heat insulating tubular as a tubular member formed of a heat resistant material such as quartz or silicon carbide may be installed.

A temperature sensor 263, which is a temperature detector, is installed in the reaction tube 203. Based on temperature information detected by the temperature sensor 263, an electrical conduction state to the heater 207 is adjusted such that the interior of the process chamber 201 has a desired temperature distribution. The temperature sensor 263 is configured in an L-shape similar to the nozzles 249a to 249c and installed along the inner wall of the reaction tube 203.

Figure 3:
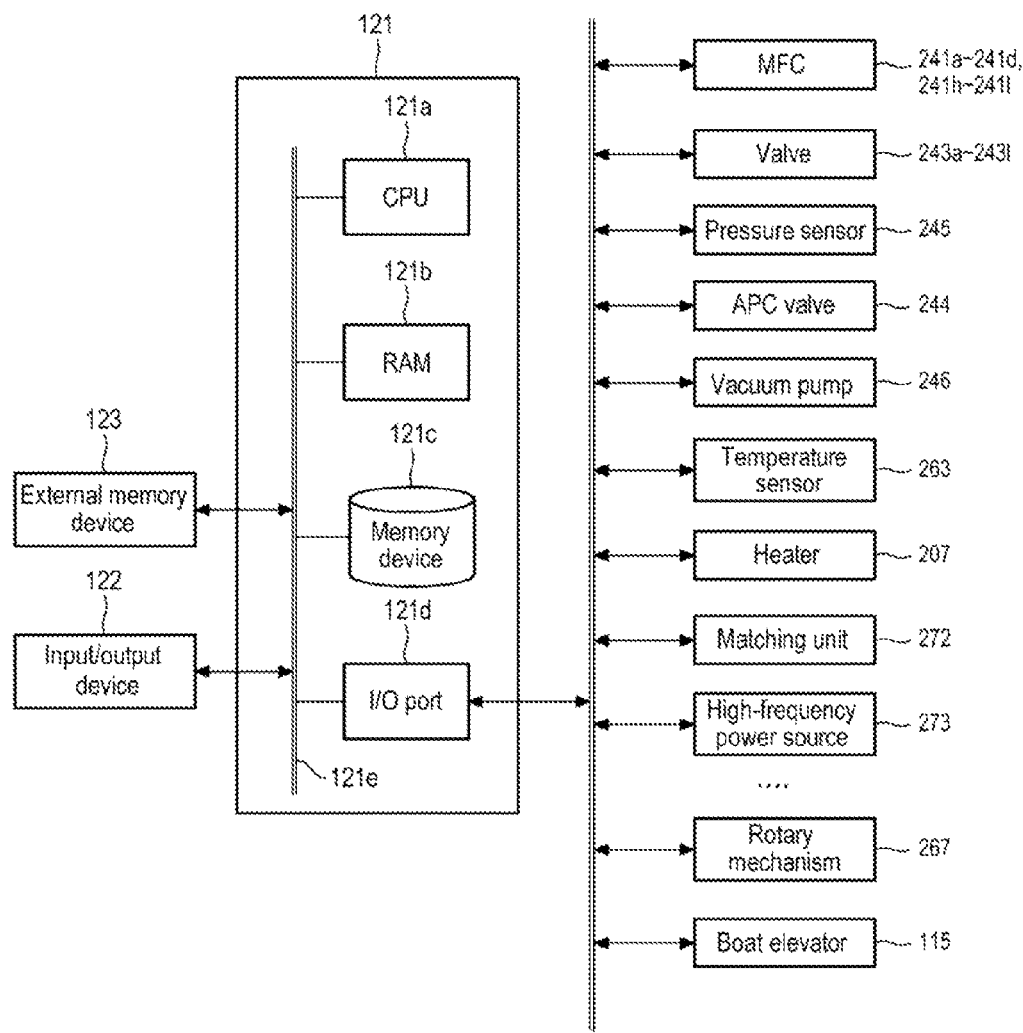
FIG. 3 is a schematic view illustrating a configuration of a controller of the substrate processing apparatus appropriately used in the first embodiment of the present disclosure, a control system of the controller being shown in a block diagram.

As illustrated in FIG. 3, a controller 121, which is a control unit (control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, an HDD (Hard Disc Drive), or the like. A control program for controlling operations of the substrate processing apparatus, a process recipe, in which a sequence or condition for a substrate processing such as a carbon-containing film formation to be described later is written, or a cleaning recipe, in which a sequence or condition for a cleaning process to be described later is written, are readably stored in the memory device 121c. The process recipe functions as a program for the controller 121 to execute each sequence in the substrate processing process, such as a carbon-containing film forming process described later, to obtain a predetermined result. The cleaning recipe functions as a program for the controller 121 to execute each sequence in the cleaning process described later to obtain a predetermined result. Hereinafter, the process recipe, the cleaning recipe or control program may be generally referred to as a program. When the term "program" is used herein, it may include the case in which only one of the process recipe, the cleaning recipe and the control program is included, or the case in which any combination of the process recipe, the cleaning recipe and the control program is included. The RAM 121b is configured as a memory area (work area) in which a program or data read by the CPU 121a is temporarily stored.

The I/O port 121d is connected to the above-described MFCs 241a to 241d and 241h to 241l, the valves 243a to 243l, the pressure sensor 245, the APC valve 244, the vacuum pump 246, the temperature sensor 263, the heater 207, the matching unit 272, the high-frequency power source 273, the rotary mechanism 267, the boat elevator 115 and the like.

The CPU 121a is configured to read and execute the control program from the memory device 121c. According to an input of an operation command from the input/output device 122, the CPU 121a reads the process recipe or the cleaning process from the memory device 121c. In addition, the CPU 121a is configured to control the flow rate controlling operation of various types of gases by the MFCs 241a to 241d and 241h to 241l the opening/closing operation of the valves 243a to 243l, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the impedance adjusting operation of the matching unit 272, the operation of supplying power by the high-frequency power source 273, and the like according to contents of the read process recipe or the cleaning recipe.

The controller 121 is not limited to being configured as a dedicated computer but may be configured as a general-purpose computer. For example, the controller 121 according to the embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. A means for supplying a program to a computer is not limited to the case in which the program is supplied through the external memory device 123. For example, the program may be supplied using a communication means such as the Internet or a dedicated line, rather than through the external memory device 123. The memory device 121c or the external memory device 123 is configured as a non-transitory computer-readable recording medium. Hereinafter, these means for supplying the program will be simply referred to as "a recording medium." When the term "recording medium" is used herein, it may include a case in which only the memory device 121c is included, a case in which only the external memory device 123 is included, or a case in which both the memory device 121c and the external memory device 123 are included.

(2) Carbon-Containing Film Forming Process

Next, an example of a sequence of forming a carbon-containing film on a substrate, which is one of the processes of manufacturing a semiconductor device by using the processing furnace 202 of the above-described substrate processing apparatus, will be described. In the following description, operations of the respective parts constituting the substrate processing apparatus are controlled by the controller 121.

In this embodiment, a carbon-containing film (C-containing film) is formed on the wafer 200 as a substrate by performing a cycle by a predetermined number of times, the cycle including: supplying a precursor gas containing silicon (Si), carbon (C) and a halogen element and having an Si—C bonding, and a catalytic gas to the wafer 200; and supplying an oxidizing gas and a catalytic gas to the wafer 200.

In addition, in this embodiment, each process is performed under a non-plasma atmosphere.

The carbon-containing film formed in an example of the sequence according to this embodiment is a film having, for example, an oxide film as a main constituent, and an oxycarbide film in which at least a portion of oxygen in the oxide film is substituted with carbon. The oxycarbide film may be considered as an oxide film doped with carbon (having carbon added thereto) or an oxide film containing carbon. In this embodiment, by supplying each gas together with a catalytic gas, a film may be formed at a relatively low temperature even under a non-plasma atmosphere, for example, thereby improving the thermal budget or the like of the semiconductor device.

Here, the cycle including each of the process of "supplying a precursor gas and a catalytic gas" and the process of "supplying an oxidizing gas and a catalytic gas" means that each process is included in one cycle once or more. Thus, in one cycle, each process may be performed once, or at least one of the processes may be performed multiple times. In one cycle, each process may be performed the same number of times or different number of times. The order of performing each process in the cycle may arbitrarily be determined. In this manner, by properly changing the number of times, the order, the combination or the like of performing each process, thin films such as C-containing films having different film quality, film composition, component ratios or the like may be formed. Also, "performing the cycle a predetermined number of times" refers to performing the cycle once or more, i.e., performing the cycle once or repeatedly performing the cycle multiple times.

In this embodiment, in order to form a thin film having a composition of a stoichiometric composition or of another predetermined composition different from the stoichiometric composition, supply conditions of a plural type of gases containing a plurality of elements constituting the thin film to be formed are controlled. For example, the supply conditions are controlled such that at least one element of the plurality of elements constituting the thin film to be formed stoichiometrically exceeds another element. Hereinafter, an example of a sequence of forming a film while controlling a ratio of the plurality of elements constituting the thin film to be formed, i.e., a composition ratio of the thin film, will be described.

Figure 4:
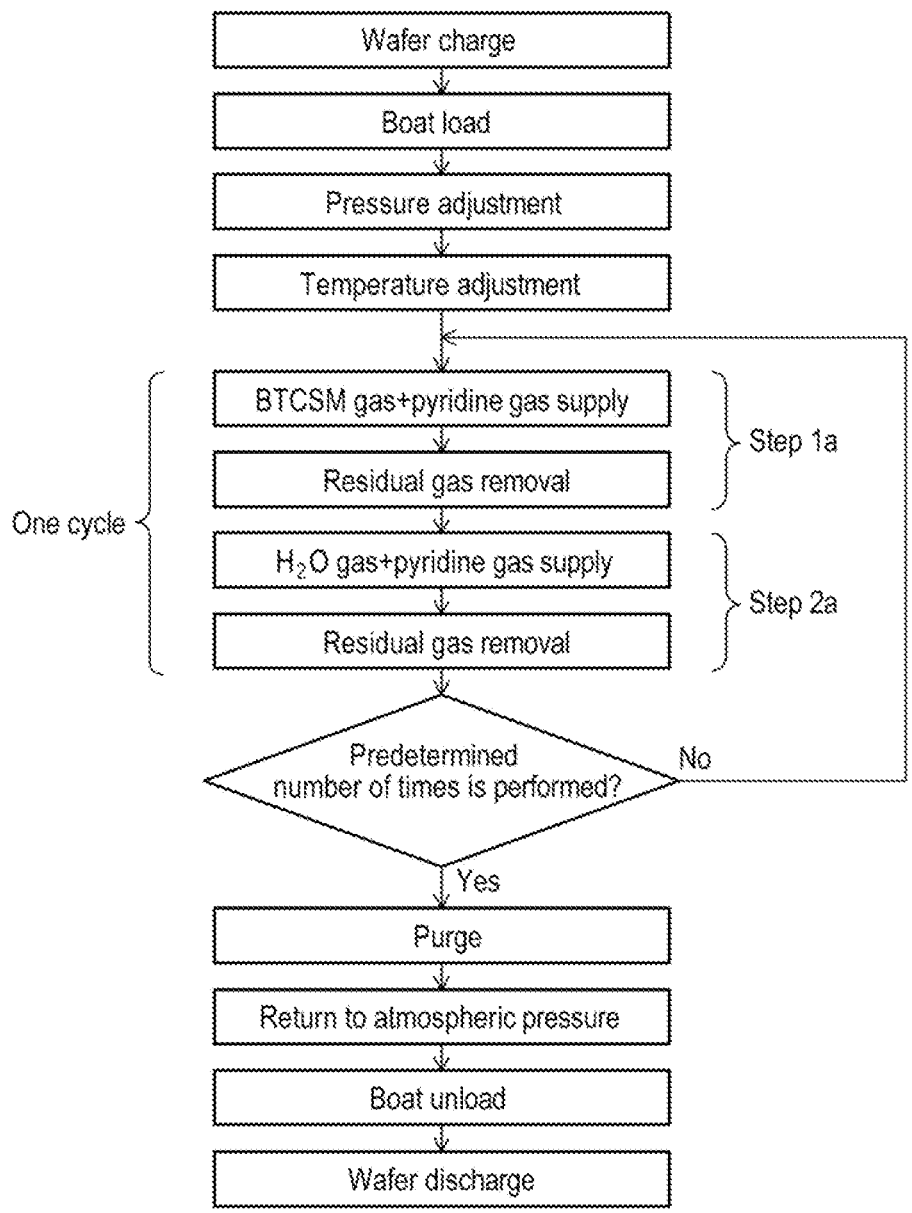
FIG. 4 is a flow chart illustrating a flow of film formation in a film forming sequence according to the first embodiment of the present disclosure.
Figure 5:
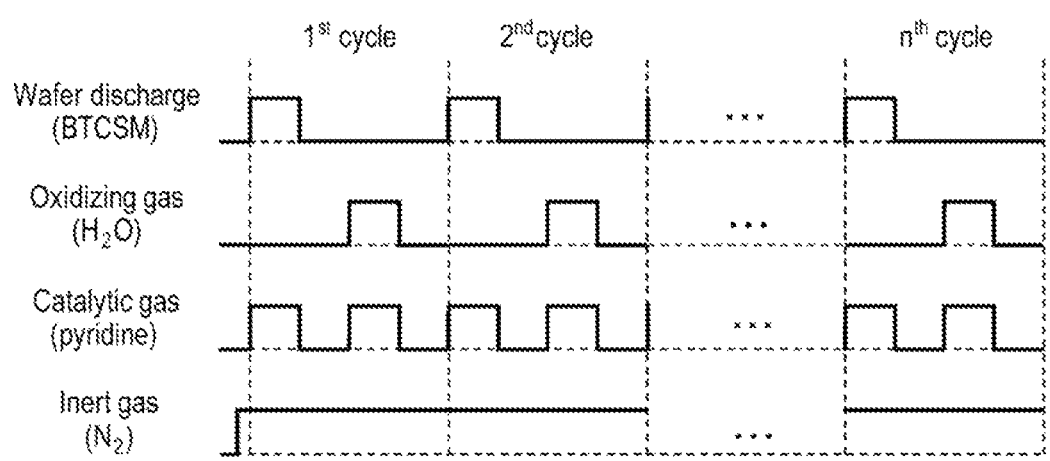
FIG. 5 is a view illustrating gas supply timings in the film forming sequence according to the first embodiment of the present disclosure.

Hereinafter, a film forming sequence of the embodiment will be described in detail with reference to FIGS. 4 and 5.

According to this embodiment, a silicon oxycarbide film (hereinafter, also referred to as an SiOC film) as an oxide film containing C is formed on a wafer 200 by performing a cycle a predetermined number of times (n times). For example, the cycle includes: a process of supplying a BTCSM gas as a precursor gas and a pyridine gas as a catalytic gas to the wafer 200 (Step 1a); and a process of supplying an $H_2O$ gas, which is an O-containing gas, as an oxidizing gas and a pyridine gas as a catalytic gas to the wafer 200 (Step 2a).

A film formed by the film forming sequence according to this embodiment is a film having a silicon oxide film (an $SiO_2$ film, hereinafter, also referred to as an SiO film) as a main constituent, and an SiOC film in which at least a portion of O in the SiO film is substituted with C. Such an SiOC film may also be referred to as an SiO film doped with C (having C added thereto) or an SiO film containing C.

When the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

The phrase "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, the phrase "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

The term "substrate" as used herein may be synonymous with the term "wafer," and in this case, the terms "wafer" and "substrate" may be used interchangeably in the above description.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The pressure in the interior of the process chamber 201 is evacuated by the vacuum pump 246 to reach a desired pressure (vacuum level). Here, the internal pressure of the process chamber 201 is measured by the pressure sensor 245, and the APC valve 244 is feedback-controlled based on the measured pressure information (pressure adjustment). The vacuum pump 246 maintains a regular operation state at least until processing of the wafers 200 is terminated. Further, the wafers 200 within the process chamber 201 are heated by the heater 207 to a desired temperature. Here, electrical conduction state of the heater 207 is feedback-controlled based on the temperature information detected by the temperature sensor 263 such that the interior of the process chamber 201 reaches a desired temperature distribution (temperature adjustment). Heating of the interior of the process chamber 201 by the heater 207 is continuously performed at least until processing of the wafers 200 is terminated. However, which will be described later, when the processing of the wafers 200 is performed at room temperature, heating of the interior of the process chamber 201 by the heater 207 may not be performed. Thereafter, the boat 217 and wafers 200 begin to be rotated by the rotary mechanism 267 (wafer rotation). The rotation of the boat 217 and wafers 200 by the rotary mechanism 267 is continuously performed at least until processing of the wafers 200 is terminated.

(SiOC Film Forming Process)

Next, the following two steps, i.e., Steps 1a and 2a, are sequentially executed.

[Step 1a]

(Supply of BTCSM Gas+Pyridine Gas)

The valve 243a is opened to flow a BTCSM gas into the precursor gas supply pipe 232a. A flow rate of the BTCSM gas is controlled by the MFC 241a, and the BTCSM gas is supplied into the process chamber 201 through the gas supply holes 250a, and exhausted through the exhaust pipe 231. In this way, the BTCSM gas is supplied to the wafer 200 (BTCSM gas supply). During the BTCSM gas supply, the valve 243i is opened to flow an inert gas such as $N_2$ gas into the gas supply pipe 232i. A flow rate of the $N_2$ gas is controlled by the MFC 241i, and the $N_2$ gas is supplied together with the BTCSM gas into the process chamber 201, and exhausted through the exhaust pipe 231.

In addition, the valve 243c is opened to flow a pyridine gas into the gas supply pipe 232c. A flow rate of the pyridine gas is adjusted by the MFC 241c, and the pyridine gas is supplied into the process chamber 201 through the gas supply holes 250c and exhausted through the exhaust pipe 231. In this way, the pyridine gas is supplied to the wafer 200 (pyridine gas supply). During the pyridine gas supply, the valve 243k is opened to flow the inert gas such as $N_2$ gas into the gas supply pipe 232k. A flow rate of the $N_2$ gas is adjusted by the MFC 241k, and the $N_2$ gas is supplied together with the pyridine gas into the process chamber 201 and exhausted through the exhaust pipe 231.

Further, in order to prevent infiltration of the BTCSM gas and the pyridine gas into the nozzles 249b and 249d or the buffer chamber 237, the valves 243j and 243l are opened to flow the $N_2$ gas into the gas supply pipes 232j and 232l. The $N_2$ gas is supplied into the process chamber 201 through the gas supply pipes 232b and 232d, the nozzles 249b and 249d, and the buffer chamber 237, and exhausted through the exhaust pipe 231.

The APC valve 244 is appropriately controlled to set the internal pressure of the process chamber 201 to fall within a range of, for example, 1 to 13330 Pa. In some embodiments, the internal pressure of the process chamber 201 may range from 133 to 2666 Pa. A supply flow rate of the BTCSM gas controlled by the MFC 241a ranges from 1 to 2000 sccm, for example, in some embodiments, 10 to 1000 sccm. A supply flow rate of the pyridine gas controlled by the MFC 241c may range, for example, from 1 to 2000 sccm, in some embodiments, 10 to 1000 sccm. A supply flow rate of each of the $N_2$ gases controlled by the MFC 241i to 241l may fall within a range of, for example, 100 to 10000 sccm. A time duration for which the BTCSM gas and the pyridine gas are supplied to the wafer 200, i.e., a gas supply time (irradiation time), may, for example, fall within a range of 1 to 100 seconds, and in some embodiments, fall within a range of 5 to 60 seconds.

The temperature of the heater 207 may be set such that a temperature of the wafers 200 may fall within a range, for example, from room temperature to 200 degrees C., from room temperature to 150 degrees C., or from room temperature to 100 degrees C. In a case where a catalytic gas is not supplied during the BTCSM gas supply, if a temperature of the wafer 200 is lower than 250 degrees C., it may be difficult for BTCSM to be chemically adsorbed onto the wafer 200, resulting in a failure of obtaining a practical film formation rate. This problem, however, can be solved in this embodiment, because the pyridine gas is supplied as a catalytic gas although the temperature of the wafer 200 is lower than 250 degrees C. With the presence of the pyridine gas, the temperature of the wafer 200 may be equal to or lower than 200 degrees C., 150 degrees C. or 100 degrees C., thereby reducing the heat amount applied to the wafer 200 and desirably controlling the thermal budget of the wafer 200. With the presence of the pyridine gas, BTCSM may be sufficiently adsorbed onto the wafer 200 at a temperature equal to or higher than room temperature, thereby obtaining a sufficient film formation rate. Thus, a temperature of the wafer 200 may fall within a range from room temperature to 200 degrees C., from room temperature to 150 degrees C., or from room temperature to 100 degrees C.

Under the foregoing conditions, the BTCSM gas is supplied to the wafer 200 to form a silicon-containing layer (Si-containing layer) containing C and Cl and having a thickness from below one atomic layer to several atomic layers, for example, as a first layer on the wafer 200 (the base film of the surface). The Si-containing layer containing C and Cl may be a silicon layer (Si layer) containing C and Cl, may be an adsorption layer of the BTCSM gas, or may include the both.

The Si layer containing C and Cl generally refers to a continuous layer or a discontinuous layer formed of Si and containing C and Cl, or a silicon thin film (Si thin film) containing C and Cl formed by overlapping these layers. In some cases, a continuous layer formed of Si and containing C and Cl may be referred as a Si thin film containing C and Cl. Si constituting the Si layer containing C and Cl includes Si whose bonding to C or Cl is completely broken as well as Si whose bonding to C or Cl is not completely broken.

The adsorption layer of the BTCSM gas includes a continuous adsorption layer of the BTCSM gas molecules and a discontinuous adsorption layer of the BTCSM gas molecules, as well. The adsorption layer of the BTCSM gas includes an adsorption layer having a thickness equal to or less than one molecular layer formed of BTCSM molecules. The BTCSM (($SiCl_3)_2CH_2$) molecules constituting the adsorption layer of the BTCSM gas includes molecules in which an Si—C bonding is partially broken or in which an Si—Cl bonding is partially broken, as well as those represented by the chemical structural formula in FIG. 12A. That is, the adsorption layer of the BTCSM gas includes a chemisorption layer of BTCSM molecules or a physisorption layer of BTCSM molecules.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing C and Cl may include both the Si layer containing C and Cl and the adsorption layer of the BTCSM gas, and as described above, the expressions such as "one atomic layer", "several atomic layers" may be used for the Si-containing layer containing C and Cl.

When a thickness of the Si-containing layer containing C and Cl formed on the wafer 200 as a first layer exceeds several atomic layers, an effect of the oxidation in Step 2a, which will be described later, does not affect the first layer. Also, a minimum value of the thickness of the first that may be formed on the wafer 200 is less than one atomic layer. Thus, the thickness of the first layer may fall within a range of less than about one atomic layer to several atomic layers. By reducing the thickness of the first layer to be one atomic layer or less, i.e., to be equal to or less than one atomic layer, the effect of the oxidation reaction in Step 2a, which will be described later, may be relatively increased and a time required for the oxidation reaction in Step 2a may be shortened. Further, a time required for forming the first layer in Step 1a may also be shortened. As a result, since a process time per cycle may be shortened, an overall process time may also be shortened. That is, a film forming rate may also be increased. In addition, by setting the thickness of the first layer to be equal to or less than one atomic layer, the film thickness uniformity can also be easily controlled.

Under a condition in which the BTCSM gas is self-decomposed (pyrolyzed), i.e., under a condition in which a pyrolysis reaction of the BTCSM gas occurs, Si is deposited on the wafer 200 to form an Si layer containing C and Cl. Under a condition in which the BTCSM gas is not self-decomposed (not pyrolyzed), i.e., under a condition in which a pyrolysis reaction of the BTCSM gas does not occur, the BTCSM gas is adsorbed onto the wafer 200 to form the adsorption layer of the BTCSM gas. Forming the silicon layer containing C and Cl on the wafer 200 can increase the film forming rate than forming the adsorption layer of the BTCSM gas on the wafer 200. However, in this embodiment, since the temperature of the wafer 200 is so low as to be 200 degrees C. or lower, for example, the formation of the adsorption layer of the BTCSM gas on the wafer 200 may be in a prominent position to formation of the Si layer containing C and Cl on the wafer 200. Also, when a catalytic gas is not supplied, a physisorption state weaker than a chemisorption state is likely to have a dominant position in bonding of BTCSM molecules to the base film such as the surface of the wafer 200 or in bonding between BTCSM molecules in the adsorption layer of the BTCSM gas. That is, in a case where a catalytic gas is not supplied, most of the adsorption layer of the BTCSM gas is likely to be formed as a BTCSM gas physisorption layer.

Figure 6A:
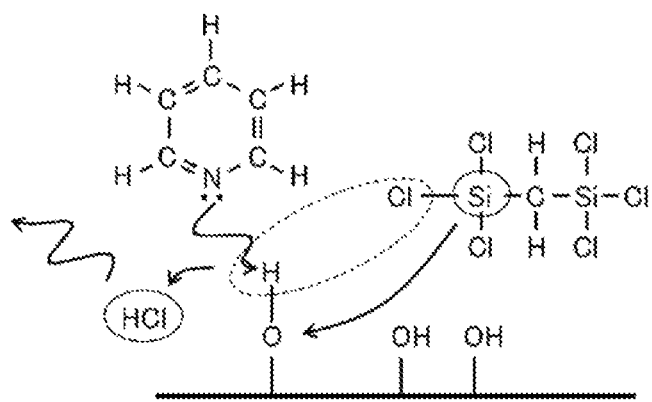

The pyridine gas as a catalytic gas weakens the bonding strength of the O—H bonding existing in the surface of the wafer 200 to accelerate decomposition of the BTCSM gas and facilitates formation of the first layer due to chemisorption of BTCSM molecules. That is, as illustrated in FIG. 6A, the pyridine gas as a catalytic gas acts on the O—H bonding existing in the surface of wafer 200, for example, to weaken the O—H bonding strength. H having weakened bonding strength reacts with Cl of the BTCSM gas to generate a hydrogen chloride (HCl) gas so as to be desorbed, and the BTCSM molecule (halide) losing Cl is chemically adsorbed onto a surface of the wafer 200 or the like. That is, a chemisorption layer of the BTCSM gas is formed on the surface of the wafer 200 or the like. The reason why the pyridine gas weakens bonding strength of O—H is because N atom having a lone pair of electrons in the pyridine molecule attracts H. For example, the foregoing acid dissociation constant (pKa) may be used as an index for a degree of action by which a predetermined compound containing the N atom or the like attracts H.

As described above, a pKa is a constant number which indicates, as a negative common logarithm, an equilibrium constant (Ka) in a dissociation reaction where hydrogen ions are released from acid, and a compound having a large pKa has strong attraction force to H. For example, by using a compound having pKa equal to or greater than 5 as a catalytic gas, decomposition of the BTCSM gas may be accelerated to facilitate a formation of the first layer. On the other hand, when pKa of a catalytic gas is excessively large, Cl separated from the BTCSM molecule and a catalytic gas are bonded to generate a component, i.e., salt (ion compound) such as ammonium chloride ($NH_4Cl$), which may become a particle source. In order to restrain this, kPa of the catalytic gas may be set to be 11 or less. In some embodiments, kPa of the catalytic gas may be set to be 7 or less. Since the pyridine gas has relatively large kPa of about 5.67, the pyridine gas has strong attraction force to H. Also, since pKa of the pyridine gas is smaller than 7, particles are hardly generated.

In the aforementioned manner, by supplying the pyridine gas as a catalytic gas together with the BTCSM gas, decomposition of the BTCSM gas may be accelerated even under a low temperature condition, for example, equal to or lower than 200 degrees C. Accordingly, the first layer is formed such that the formation of a chemisorption layer is more dominant than the formation of a physisorption layer of the BTCSM gas.

Further, although it is difficult to introduce C into a film such as an SiOC film under a condition of a relatively low temperature, by using the BTCSM gas as a precursor gas containing Si, C and a halogen element and having an Si—C bonding as described above, C may be introduced into the first layer even when the temperature is low, for example, equal to or lower than 200 degrees C. Here, C may be easily introduced into the first layer, in a state where a bonding to Si still remains unbroken in the precursor gas and at least a portion of C forms the Si—C bonding. The first layer containing C is oxidized in Step 2a performed thereafter to form, for example, a silicon oxycarbide layer (SiOC layer) containing C with high carbon concentration, or to form an SiOC film containing C with high carbon concentration in which such SiOC layers are stacked.

In addition, the BTCSM gas or the pyridine gas supplied into the process chamber 201 may be supplied to the wafer 200 and also to the surfaces of members in the process chamber 201, i.e., to the inner wall of the reaction tube 203, the inner wall of the manifold 209, and the surface of a member of the boat 217 or the like loaded into the process chamber 201. As a result, the foregoing first layer (the Si-containing layer containing C and Cl) is also formed on the surfaces of the members in the process chamber 201, as well as on the wafer 200. Similar to the first layer formed on the wafer 200, the first layer formed on the surfaces of the members in the process chamber 201 may include an adsorption layer of the BTCSM gas, an Si layer containing C and Cl, or both, and at least a portion of C has the Si—C bonding. At this time, since a temperature of members positioned in a region not surrounded by the heater 207 arranged in a lower portion within the process chamber 201, i.e., a temperature of members positioned in a region other than the wafer arrangement region, is relatively lower than the predetermined temperature, adsorption of the BTCSM gas and formation of the first layer on the surfaces of such members may be facilitated. Such a portion (members) may include, for example, an inner wall in the vicinity of a lower end portion of the reaction tube 203, an inner wall of the manifold 209, a lower portion of the nozzles 209a to 249d, a lower portion of the buffer chamber 237, an upper surface of the seal cap 219, a lateral surface of the rotary shaft 255, the heat insulating plates 218 and the like.

(Residual Gas Removal)

After the Si-containing layer containing C and Cl is formed as the first layer on the wafer 200, the valve 243a is closed to stop the supply of the BTCSM gas. Also, the valve 243c is closed to stop the supply of the pyridine gas. At this time, while the APC valve 244 of the exhaust pipe 231 is in an open state, the pressure of the interior of the process chamber 201 is evacuated by the vacuum pump 246, and the residual BTCSM gas and the residual pyridine gas remaining in the process chamber 201, which do not react or remain after the formation of the first layer, are removed from the process chamber 201 (removal of residual gas). Also, the valves 243i to 243l are in an open state, and the supply of the $N_2$ gas as an inert gas into the process chamber 201 is maintained. The $N_2$ gas acts as the purge gas, and thus, the residual BTCSM gas and the residual pyridine gas remaining in the process chamber 201, which do not react or remain after the formation of the first layer, can be effectively removed from the process chamber 201.

The residual gas remaining in the process chamber 201 may not completely be removed, and the interior of the process chamber 201 may not completely be purged. When the residual gas remaining in the process chamber 201 is very small in amount, no adverse effect may occur in Step 2a performed thereafter. Here, a flow rate of the $N_2$ gas supplied into the process chamber 201 need not be high, and for example, approximately the same amount of the $N_2$ gas as the volume of the reaction tube 203 (the process chamber 201) may be supplied to perform the purge such that no adverse effect occurs in Step 2a. As described above, since the interior of the process chamber 201 is not completely purged, the purge time can be reduced and the throughput can be improved. In addition, the consumption of the $N_2$ gas can be prevented to a minimal necessity.

As the precursor gas containing Si, C and a halogen element and having an Si—C bonding, a BTCSE gas, a TCDMDS gas, a DCTMDS gas and the like may be used, in addition to the BTCSM gas. As the catalytic gas, an amine-based gas such as an aminopyridine gas, a picoline gas, a lutidine gas, a piperazine gas or a piperidine gas, in addition to the pyridine gas, may be used, or a non-amine-based gas such as an ammonia gas ($NH_3$, pKa=9.2) or the like may be used. As the inert gas, a rare gas such as an Ar gas, a He gas, a Ne gas, or a Xe gas, in addition to the $N_2$ gas, may be used.

[Step 2a]

(Supply of $H_2O$ Gas+Pyridine Gas)

After Step 1a is terminated and the residual gas within the process chamber 201 is removed, the valve 243b is opened to flow an $H_2O$ gas into the gas supply pipe 232b. A flow rate of the $H_2O$ gas is controlled by the MFC 241b, and the $H_2O$ gas is supplied into the buffer chamber 237 through the gas supply holes 250b. The $H_2O$ gas supplied into the buffer chamber 237 is supplied into the process chamber 201 through the gas supply holes 250e, and exhausted through the exhaust pipe 231. In this way, the $H_2O$ gas is supplied to the wafer 200 under a non-plasma atmosphere ($H_2O$ gas supply). At this time, the valve 243j is opened to flow the $N_2$ gas as an inert gas into the gas supply pipe 232j. A flow rate of the $N_2$ gas is controlled by the MFC 241j, and the $N_2$ gas is supplied together with the $H_2O$ gas into the process chamber 201, and exhausted through the exhaust pipe 231.

Also, a pyridine gas is supplied to the wafer 200, like the supply of the pyridine gas in Step 1a.

Moreover, in order to prevent infiltration of the $H_2O$ gas and the pyridine gas into the nozzles 249a and 249d, the valves 243i and 243l are opened to flow the $N_2$ gas into the gas supply pipes 232i and 232l. The $N_2$ gas is supplied into the process chamber 201 through the gas supply pipes 232a and 232d and the nozzles 249a and 249d, and exhausted through the exhaust pipe 231.

At this time, the APC valve 244 is appropriately controlled to set the internal pressure of the process chamber 201 to fall within a range of, for example, 1 to 13330 Pa. In some embodiments, the internal pressure of the process chamber 201 is set to range from 133 to 2666 Pa. A supply flow rate of the $H_2O$ gas controlled by the MFC 241b may be controlled to fall within a range of, for example, 10 to 10000 sccm, in some embodiments, 10 to 1000 sccm. A supply flow rate of the pyridine gas is controlled by the MFC 241c may range, for example, from 1 to 2000 sccm, in some embodiments, 10 to 1000 sccm. Supply flow rates of the $N_2$ gas controlled by the MFCs 241i to 241l are set to fall within a range of, for example, 100 to 10000 sccm, respectively. A time duration for which the $H_2O$ gas and the pyridine gas are supplied to the wafer 200, i.e., a gas supply time (or irradiation time), may be controlled to fall within a range of, for example, 1 to 100 seconds, in some embodiments, 5 to 60 seconds. A temperature of the heater 207 may be set such that the wafer 200 has the same temperature range to that in Step 1a, i.e., within a range, for example, from room temperature to 200 degrees C., from room temperature to 150 degrees C., and from room temperature to 100 degrees C.

The $H_2O$ gas supplied into the process chamber 201 is activated by heat and exhausted through the exhaust pipe 231. At this time, the $H_2O$ gas activated by heat is supplied to the wafer 200. That is, the gas flowing into the process chamber 201 is thermally activated the $H_2O$ gas, and the BTCSM gas does not flow in the process chamber 201. Thus, the $H_2O$ gas is supplied in an activated state to the wafer 200, without causing a gas phase reaction, and reacts with at least a portion of the first layer (the Si-containing layer containing C and Cl) formed on the wafer 200 in Step 1a. Accordingly, the first layer is thermally oxidized with non-plasma so as to be modified into a second layer containing Si, O and C, i.e., an SiOC layer.

Figure 6B:
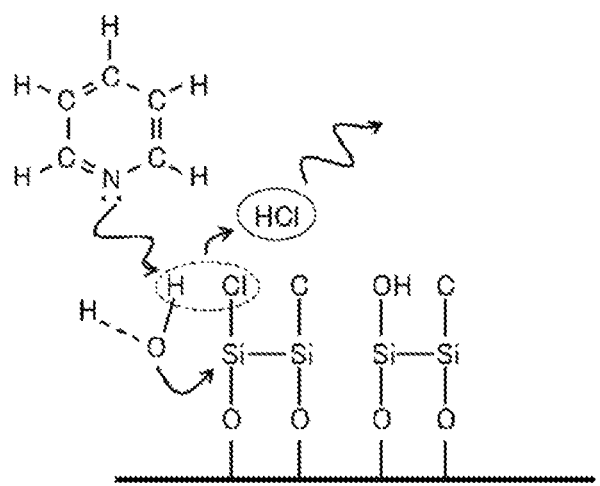

The pyridine gas as a catalytic gas weakens the bonding strength of an O—H bonding of the $H_2O$ gas, accelerating decomposition of the $H_2O$ gas and accelerating the reaction between the $H_2O$ gas and the first layer. That is, as illustrated in FIG. 6B, the pyridine gas acts as a catalyst on the O—H bonding of the $H_2O$ gas to weaken the bonding strength of O—H. H with the weakened bonding strength and Cl of the first layer and formed on the wafer 200 react with each other to generate a hydrogen chloride (HCl) gas, which is desorbed, and O of the $H_2O$ gas, which has lost H, is bonded to Si of the first layer having at least some C remaining after the desorption of Cl.

In the aforementioned manner, the SiOC layer is formed on the wafer 200. It is considered that at least a portion of C in the SiOC layer still forms the Si—C bonding.

In addition, the activated $H_2O$ gas or pyridine gas in the process chamber 201 is supplied not only to the wafer 200, but also to the surfaces of the members in the process chamber 201, such as the inner wall of the reaction tube 203 and the like. As a result, at least a portion of the first layer formed on the surfaces of the members in the process chamber 201 is modified into the second layer (SiOC layer) having an Si—C bonding in at least a portion thereof, like the first layer formed on the wafer 200. Here, the second layer containing a relatively large amount of moisture ($H_2O$) may be easily formed under a low temperature equal to or lower than 200 degrees C., for example. The moisture contained in the second layer results from the $H_2O$ gas which has been used as an oxidizing gas or the like, for example. Also, a temperature of the aforementioned region other than the wafer arrangement region within the process chamber 201 is lower than that of the wafer arrangement region, and a degree of activation of the supplied $H_2O$ gas is lowered in this region. As a result, a layer having a relatively high C concentration, similar to a non-reacted first layer or an insufficiently-oxidized second layer, may be easily formed on the foregoing members positioned in the region other than the wafer arrangement region.

(Residual Gas Removal)

Thereafter, the valve 243b is closed to stop the supply of the $H_2O$ gas. Also, the valve 243c is closed to stop the supply of the pyridine gas. At this time, while the APC valve 244 of the exhaust pipe 231 is in an open state, the pressure of the interior of the process chamber 201 is evacuated by the vacuum pump 246, and the residual $H_2O$ gas or the residual pyridine gas remaining in the process chamber 201 which does not react or remains after reaction, or reaction byproducts are removed from the process chamber 201 (removal of residual gas). Also, the valves 243i to 243l are in an open state, and the supply of the $N_2$ gas as an inert gas into the process chamber 201 is maintained. The $N_2$ gas acts as a purge gas, whereby the residual $H_2O$ gas or the residual pyridine gas remaining in the process chamber 201 which does not react or remains after formation of the second layer, or the reaction byproducts can be effectively removed from the process chamber 201.

The gas residual remaining in the process chamber 201 may not completely be removed, and the interior of the process chamber 201 may not completely be purged. When the residual gas remaining in the process chamber 201 is very small in amount, there is no adverse effect generated in Step 1a to be performed thereafter. A flow rate of the $N_2$ gas supplied into the process chamber 201 need not be high, and for example, approximately the same amount of the $N_2$ gas as the volume of the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the $N_2$ gas can also be prevented to a minimal necessity.

As the oxidizing gas, an O-containing gas such as a hydrogen peroxide ($H_2O_2$) gas, a hydrogen ($H_2$) gas+an oxygen ($O_2$) gas, an $H_2$ gas+an ozone ($O_3$) gas or the like, in addition to the $H_2O$ gas, may be used. As the catalytic gas, various amine-based gases and non-amine-based gases as described above by way of example, in addition to the pyridine gas, may be used. As the inert gas, various rare gases as described above by way of example, in addition to the $N_2$ gas, may be used.

(Performing Predetermined Number of Times)

The foregoing Steps 1a and 2a may be set as one cycle, and the cycle may be performed once or more, i.e., a predetermined number of times (n times) to form the SiOC film having a predetermined composition and a predetermined film thickness on the wafer 200. In some embodiments, the foregoing cycle is repeated a predetermined number of times. That is, in some embodiments, a thickness of the SiOC layer formed per cycle is set to be smaller than a desired film thickness and the foregoing cycle is repeated a predetermined number of times until a desired film thickness is obtained.

At this time, ratios of the respective element components in the SiOC layer including the Si component, the O component and the C component (i.e., the Si concentration, the O concentration and the C concentration) may be controlled by controlling the processing conditions such as the internal pressure of the process chamber 201 or the gas supply time in each step, whereby a composition ratio of the SiOC film may be controlled.

Further, when the cycle is performed a predetermined number of times, the expression of "a predetermined gas is supplied to the wafer 200" in each step after at least the second cycle means that "a predetermined gas is supplied to a layer formed on the wafer 200, i.e., on the uppermost surface of the wafer 200 as a laminated body", and the expression of "a predetermined layer is formed on the wafer 200" means that "a predetermined layer is formed on a layer formed on the wafer 200, i.e., on the uppermost surface of the wafer 200 as a laminated body". This is the same as described above, and also the same in the explanations of the cases where a cycle is performed multiple number of times in modifications and other embodiments, which will be described later.

In addition, by performing the cycle a predetermined number of times, deposits including the SiOC film as a C-containing layer containing a relatively large amount of moisture are deposited on the surfaces of the members in the process chamber 201, such as the inner wall of the reaction tube 203 and the like. The SiOC film included in the deposits is a film having, for example, an SiO film as a main constituent, and an SiOC film in which at least a portion of O in the SiO film is substituted with C, like the SiOC film formed on the wafer 200. From the above reason, such deposits may be formed to be thicker on the members positioned in the region other than the wafer arrangement region of a relatively low temperature. Also, such deposits include a larger amount of non-oxidized film or insufficiently-oxidized SiOC film.

(Purging and Returning to Atmospheric Pressure)

After the film forming processing of forming the SiOC film having a predetermined composition and a predetermined film thickness is performed, the valves 243i to 243l are opened to supply the $N_2$ gas as an inert gas into the process chamber 201 from each of the gas supply pipes 232i to 232l and the $N_2$ gas is exhausted through the exhaust pipe 231. The $N_2$ gas acts as a purge gas, whereby the interior of the process chamber 201 is purged with the inert gas and the residual gas remaining in the process chamber 201 and reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unloading and Wafer Discharging)

Thereafter, the seal cap 219 is lowered by the boat elevator 115 to open the lower end of the manifold 209, and the processed wafers 200 supported by the boat 217 are unloaded to the outside of the reaction tube 203 through the lower end of the manifold 209 (boat unloading). Then, the processed wafers 200 are discharged from the boat 217 (wafer discharging).

Subsequently, a process (hereinafter, also referred to as "batch process") from the wafer charging to the wafer discharging is performed a predetermined number of times. Here, since the foregoing deposits are deposited on the members in the process chamber, a cleaning process to remove the deposits deposited on the members in the process chamber by supplying an etching gas such as an F-containing gas or the like into the process chamber may be performed.

In this embodiment, by performing the cleaning process described below, the cleaning efficiency may be enhanced and the deposits deposited in the process chamber 201 may be more reliably removed.

(3) Cleaning Process

Hereinafter, an example of sequence in which the interior of the process chamber 201 is cleaned after the film forming process will be described. In the following description, operations of respective parts constituting the substrate processing apparatus are controlled by the controller 121.

A cleaning process to clean the process chamber 201 is performed at a point in time when a thickness of the deposits deposited on the members in the process chamber 201 reaches a predetermined thickness before the deposits begin to peel and fall.

A cleaning sequence according to this embodiment is a sequence of cleaning the interior of the process chamber 201 after the process of forming the SiOC film as a C-containing film on the wafer 200 is performed in the process chamber 201, by performing a cycle a predetermined number of times. The cycle including: a process of supplying a modifying gas into the process chamber 201 to modify the deposits including the SiOC film deposited on the surfaces of the members in the process chamber 201; and a process of supplying an etching gas into the process chamber 201 to remove the modified deposits through a thermochemical reaction.

In addition, in this embodiment, the process of supplying a modifying gas is performed by supplying a modifying gas excited to a plasma state, and the process of supplying an etching gas is performed under a non-plasma atmosphere.

Figure 7:
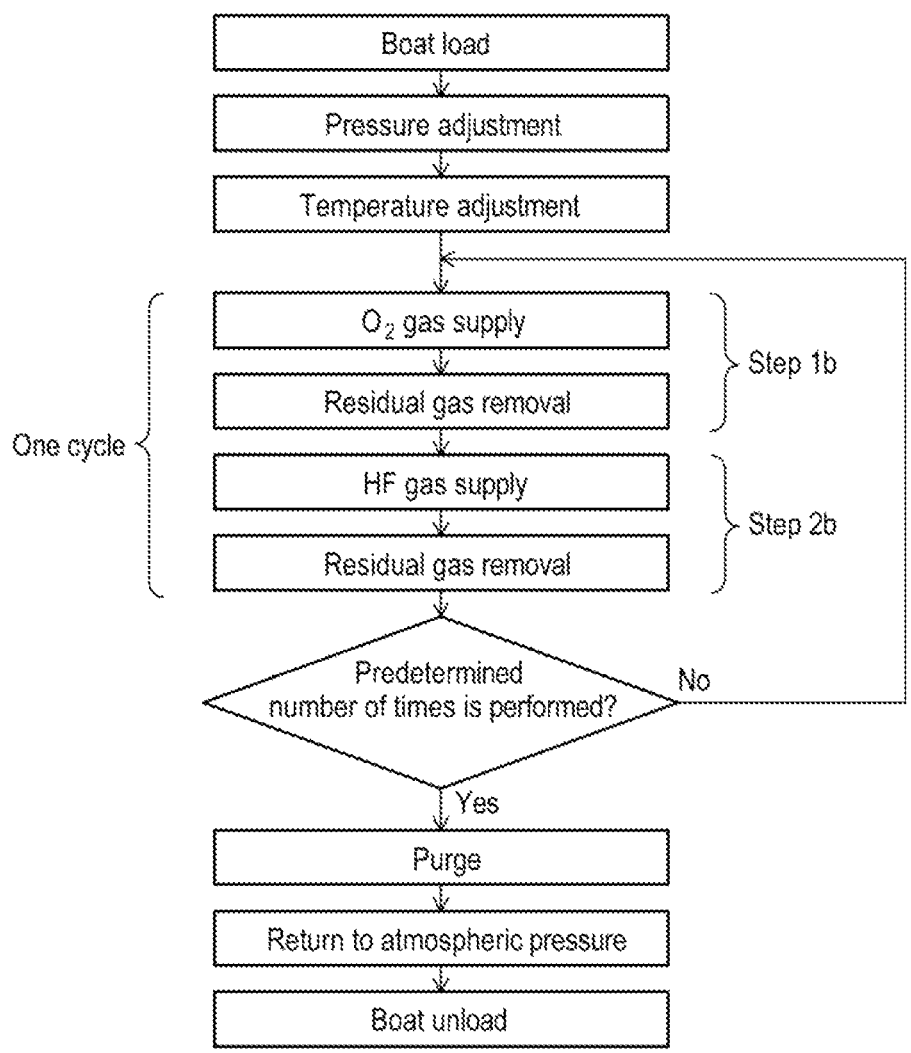
FIG. 7 is a view illustrating a cleaning flow in a cleaning sequence according to the first embodiment of the present disclosure.

Hereinafter, the cleaning sequence according to this embodiment will be described with reference to FIGS. 7 and 8A.

Here, an example, in which a cycle is performed a predetermined number of times, for example, once, the cycle including: a process of supplying an $O_2$ gas, which is an O-containing gas and excited into a plasma state, as a modifying gas into the process chamber 201 to modify the deposits including the SiOC film deposited on the surfaces of the members in the process chamber 201 (Step 1b); and a process of supplying an HF gas, which is an F-containing gas, as an etching gas into the process chamber 201 to remove the modified deposits through a thermochemical reaction (Step 2b), will be described.

(Boat Loading)

An empty boat 217 with no wafer 200 loaded therein is lifted by the boat elevator 115 so as to be transferred into the process chamber 201 (boat loading). In this state, the seal cap 219 seals the lower end portion of the manifold 209 through the O ring 220b.

(Pressure Adjustment and Temperature Adjustment)

The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). The vacuum pump 246 maintains a regular operation state at least until the cleaning process is terminated. Further, the interior of the process chamber 201 is heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). The interior of the process chamber 201 by the heater 207 is continuously heated to be maintained at a predetermined temperature at least until the cleaning process is terminated. However, as described later, when the cleaning process is performed at room temperature, the process chamber 201 may not be heated by the heater 207. Next, the boat 217 begins to be rotated by the rotary mechanism 267. The boat 217 is continuously rotated by the rotary mechanism 267 at least until the cleaning process is terminated. However, the boat 217 may not be rotated.

(Cleaning Process)

Thereafter, the subsequent two steps, i.e., Steps 1b and 2b, are sequentially executed.

[Step 1b]

($O_2$ Gas Supply)

The valve 243h is opened to flow an $O_2$ gas into the gas supply pipe 232h. A flow rate of the $O_2$ gas is controlled by the MFC 241h, and the $O_2$ gas is supplied into the buffer chamber 237 through the gas supply holes 250h. At this time, by applying high-frequency (RF) power from the high-frequency power source 273 between the rod-shaped electrodes 269 and 270 through the matching unit 272, the $O_2$ gas supplied into the buffer chamber 237 is plasma-excited, supplied as active species into the process chamber 201 through the gas supply holes 250e, and exhausted through the exhaust pipe 231. In this way, the $O_2$ gas activated (excited) to a plasma state is supplied to the deposits deposited on the surfaces of the members in the process chamber 201 ($O_2$ gas supply). While supplying the $O_2$ gas, the valve 243j is opened to flow an $N_2$ gas into the gas supply pipe 232j. A flow rate of the $N_2$ gas is controlled by the MFC 241j and the $N_2$ gas is supplied together with the $O_2$ gas into the process chamber 201 and exhausted through the exhaust pipe 231. When each gas is supplied, the $N_2$ gas supply is appropriately performed to prevent a gas infiltration to the nozzles 249a, 249c and 249d, which are not in use, like the foregoing embodiment.

At this time, the APC valve 244 is appropriately controlled to set the internal pressure of the process chamber 201 to fall within a range of, for example, 1 to 13330 Pa, in some embodiments, 133 to 2666 Pa. A supply flow rate of the $O_2$ gas controlled by the MFC 241b is set to fall within a range of, for example, 10 to 10000 sccm, in some embodiments, 10 to 1000 sccm. Supply flow rates of the $N_2$ gases controlled by the MFCs 241i to 241l are set to fall within a range of, for example, 100 to 10000 sccm, respectively. A time duration in which the $O_2$ gas is supplied into the process chamber 201, i.e., a gas supply time (irradiation time) is set to fall within a range of, for example, 1 to 100 seconds, in some embodiments, 5 to 60 seconds. A temperature of the heater 207 in the process chamber 201 is set to fall within a temperature range identical to that of the wafer 200 in the SiOC film forming process as described above, i.e., for example, within a temperature range of room temperature to 200 degrees C., in some embodiments, room temperature to 150 degrees C., and in some other embodiments, room temperature to 100 degrees C. The high-frequency power applied from the high-frequency power source 273 between the rod-shaped electrodes 269 and 270 is set to fall within a range of, for example, 50 to 1000 W.

Here, the gas flowing into the process chamber 201 is an $O_2$ gas excited to a plasma state, and includes active species such as O radicals (O*), for example. The $O_2$ gas excited to a plasma state is supplied in the activated state to the surfaces of the members in the process chamber 201. Mainly by the active species, the deposits including the SiOC film formed on the surfaces of the members in the process chamber 201 in the foregoing SiOC film forming process is modified. The energy of the active species is higher than the energy of the thermally activated $H_2O$ gas in the foregoing SiOC film forming process, for example. By providing energy of the active species to the deposits, the deposits including the SiOC film may further be oxidized and modified. That is, a degree of oxidation of the deposits may be increased. Specifically, by providing energy of the active species to the deposits, at least a portion of the Si—C bonding included in the deposits including the SiOC film is broken. O* as the active species is bonded to a remaining bonding electrons of Si separated from the Si—C bonding. C separated from the Si—C bonding is desorbed from the deposits as, for example, a carbon monoxide (CO) gas or a carbon dioxide ($CO_2$) gas. These reactions may take place even in the region other than the wafer arrangement region where a temperature is relatively low, due to the high energy of the active species. That is, the foregoing reactions may take place even on insufficiently-oxidized deposits having a high C concentration deposited in the region other than the wafer arrangement region. Through this plasma chemical reaction (plasma processing), at least a portion of C in the deposits including the SiOC film is desorbed, and thus, the deposits are modified into deposits including an SiOC component having decreased C concentration or an SiO component having C concentration lower than an impurity level, i.e., the deposits are modified into more oxidized deposits.

As described above, the modification of the deposits is performed by desorbing at least a portion of C included in the deposits from the deposits. Here, in some embodiments, C included in the deposits is desorbed until the C concentration in the deposits reaches to at least below the impurity level. A level below the impurity level refers to concentration below several %, for example, 5%. That is, by modifying the deposits, the oxide film containing C (SiOC film) included in the deposits is modified into an oxide film without containing C (SiO film) or an oxide film containing C (SiOC film) having C concentration at least lower than that of the SiOC film prior to the modification process, for example, an oxide film (SiO film) having C concentration lower than the impurity level. In addition, by the modification process, most of the moisture contained in the deposits remains therein, rather than being removed.

Further, the $N_2$ gas that flows together with the $O_2$ gas may act as an assist gas assisting plasma igniting. Also, the $N_2$ gas may act as an assist gas assisting dissociation of the $O_2$ gas in plasma. However, the $O_2$ gas may be converted to a plasma state without being assisted. Based on this, the $O_2$ gas may be supplied alone into the buffer chamber 237 so as to be excited to a plasma state, and the $O_2$ gas converted to the plasma state may be supplied into the process chamber 201.

(Residual Gas Removal)

After the deposits including the SiOC film are modified, the high frequency power between the rod-shaped electrodes 269 and 270 from the high-frequency power source 273 is stopped being applied. Also, the valve 243h is closed to stop the supply of the $O_2$ gas. At this time, while the APC valve 244 of the exhaust pipe 231 is in an open state, the interior of the process chamber 201 is vacuum exhausted by the vacuum pump 246, and the $O_2$ gas remaining in the process chamber 201 which does not react or remains after the reaction, or reaction byproducts are removed from the process chamber 201 (residual gas removal). Also, the valves 243i to 243l are in an open state, and the supply of the $N_2$ gas as an inert gas into the process chamber 201 is maintained. The $N_2$ gas acts as a purge gas, and thus, the $O_2$ gas remaining in the process chamber 201 which does not react or remains after the modification of the deposits, or the reaction byproducts can be more effectively removed from the process chamber 201.

The gas remaining in the process chamber 201 may not be completely removed, and the interior of the process chamber 201 may not be completely purged. When the gas remaining in the process chamber 201 is very small in amount, no adverse effect is generated in Step 2b performed thereafter. Also, a flow rate of the $N_2$ gas supplied into the process chamber 201 need not be high, and for example, the flow rate of the $N_2$ gas approximately corresponding to the volume of the reaction tube 203 (the process chamber 201) may be supplied to perform the purge so that no adverse effect is generated in Step 2b. By not purging the interior of the process chamber 201 completely, the purge time can be reduced and the throughput can be improved. In addition, the consumption of the $N_2$ gas can also be prevented to a minimal necessity.

As the modifying gas, an O-containing gas such as a carbon monoxide (CO) gas, a carbon dioxide ($CO_2$) gas, a nitrogen monoxide (NO) gas or a nitrous oxide ($N_2O$) gas, in addition to the $O_2$ gas, may be used. As the inert gas, a rare gas such as an Ar gas, a He gas, a Ne gas or a Xe gas, in addition to the $N_2$ gas, may be used. These inert gases may be also used as the assist gas as described above.

[Step 2b]

(HF Gas Supply)

After Step 1b is terminated and a residual gas in the process chamber 201 is removed, the valve 243d is opened to flow an HF gas into the gas supply pipe 232d. A flow rate of the HF gas is controlled by the MFC 241d and the HF gas is supplied into the process chamber 201 through the gas supply holes 250d and exhausted through the exhaust pipe 231. In this way, the HF gas is supplied to the deposits modified in Step 1b on the surfaces of the members in the process chamber 201 (HF gas supply). During the HF gas supply, the valve 243l is opened to flow an insert gas such as $N_2$ gas into the gas supply pipe 232l. A flow rate of the $N_2$ gas is controlled by the MFC 241l and the $N_2$ gas is supplied together with the HF gas into the process chamber 201 and exhausted through the exhaust pipe 231.

At this time, in addition to the supply of the HF gas from the nozzle 249d through the valve 243d, or instead of this, the HF gas may be supplied from the nozzle 249a through the valve 243e. That is, the valve 243e is opened to flow the HF gas into the gas supply pipe 232a through the branched gas supply pipe 232d, while controlling a flow rate of the HF gas by the MFC 241d. The HF gas is supplied into the process chamber 201 through the gas supply holes 250a and exhausted through the exhaust pipe 231 (HF gas supply). During the HF gas supply, the valve 243i is opened to flow an inert gas such as $N_2$ gas into the gas supply pipe 232i. A flow rate of the $N_2$ gas is controlled by the MFC 241i and the $N_2$ gas is supplied together with the HF gas into the process chamber 201 and exhausted through the exhaust pipe 231.

In addition, in order to prevent infiltration of the HF gas into the nozzles 249b and 249c or the buffer chamber 237, the valves 243j and 243k are opened to flow the $N_2$ gas into the gas supply pipes 232j and 232k. The $N_2$ gas is supplied into the process chamber 201 through the gas supply pipes 232b and 232c, the nozzles 249b and 249c, and the buffer chamber 237, and exhausted through the exhaust pipe 231.

At this time, the APC valve 244 is appropriately controlled to set the internal pressure of the process chamber 201 to fall within a range of, for example, 1 to 13330 Pa, in some embodiments, 133 to 2666 Pa. A supply flow rate of the HF gas controlled by the MFC 241d is set to fall within a range of, for example, 500 to 3000 sccm. Supply flow rates of the $N_2$ gases controlled by the MFCs 241i to 241l are set to fall within a range of, for example, 500 to 10000 sccm, as a total supply flow rate. Further, a ratio of the supply flow rate (sccm) of the HF gas to the total supply flow rate (sccm) of the $N_2$ gas is set to fall within a range of 0.1 to 1.0, in some embodiments, 0.2 to 0.3. When the ratio is increased, a removal rate (etching rate) of the deposits deposited on the members in the process chamber 201 may be increased. Also, the HF gas may be supplied alone, without being supplied together with the $N_2$ gas. However, if the ratio of the HF gas is set to be 100% or excessively increased, the respective members may be easily damaged by the HF gas. Thus, in this case, the $N_2$ gas may be supplied together with the HF gas to set the flow rate ratio of the HF gas to the $N_2$ gas to fall within a range of 0.1 to 1.0, in some embodiments, 0.2 to 0.3. A time duration in which the HF gas is supplied into the process chamber 201 is set to fall within a range of, for example, 1 to 120 minutes, in some embodiments, 10 to 120 minutes.

A temperature of the heater 207 is set to fall within a temperature range identical to the internal temperature of the process chamber 201 in Step 1b, i.e., for example, within a temperature range of room temperature to 200 degrees C., in some embodiments, room temperature to 150 degrees C., and in some other embodiments, room temperature to 100 degrees C. If the internal temperature of the process chamber 201 exceeds 200 degrees C., the deposits deposited on the members in the process chamber 201 may be contracted to be partially peeled off, and, for example, fall downwardly to remain in the vicinity of a furnace port. Such peeled-off and dropped deposits may act as a particle source. This problem may be solved by setting the internal temperature of the process chamber 201 to below 200 degrees C. When the internal temperature of the process chamber 201 is set to below 150 degrees C. or below 100 degrees C., contraction of the deposits may be further prevented, to thereby further preventing generation of particles. In addition, a thermochemical reaction between the HF gas and the modified deposits as described later takes place by the medium of the moisture ($H_2O$) contained in the deposits, i.e., the thermochemical reaction is triggered by the moisture contained in the deposits. Without the mediation of the moisture, it is difficult to progress the thermochemical reaction. By setting the internal temperature of the process chamber 201 to be equal to or higher than room temperature, a sufficient amount of the moisture may be released from the deposits and the thermochemical reaction between the HF gas and the deposits may be accelerated, whereby the deposits may be removed from the members in the process chamber 201. Thus, the internal temperature of the process chamber 201 may be set to fall within a range of any one of room temperature to 200 degrees C., in some embodiments, room temperature to 150 degrees C., and in some other embodiments, room temperature to 100 degrees C.

The HF gas supplied into the process chamber 201 is activated by heat and exhausted through the exhaust pipe 231. Here, the HF gas activated by heat is supplied to the deposits which has been deposited on the surfaces of the members in the process chamber 201, i.e., the inner wall of the reaction tube 203, the inner wall of the manifold 209, the boat 217 and the like installed in the process chamber 201, and which has also been modified in Step 1b. Accordingly, the SiO component or the like contained in the modified deposits thermochemically reacts with the HF gas activated by heat under a non-plasma atmosphere so as to be gasified into silicon fluoride ($SiF_4$), $H_2O$ or the like, whereby the deposits deposited on the respective members is removed. Here, the moisture released from the deposits triggers the thermochemical reaction, as mentioned above.

(Residual Gas Removal and Purging)

Thereafter, the valve 243d is closed to stop the supply of the HF gas. When the HF gas is supplied from the nozzle 249a during the HF gas supply, the valve 243e is closed. At this time, while the APC valve 244 of the exhaust pipe 231 is in an open state, the interior of the process chamber 201 is vacuum exhausted by the vacuum pump 246, and the HF gas remaining in the process chamber 201 which does not react or remains after the reaction, or reaction byproducts are removed from the process chamber 201 (residual gas removal). Also, the valves 243i to 243l are in an open state, and the supply of the $N_2$ gas as an inert gas into the process chamber 201 is maintained. The $N_2$ gas acts as a purge gas, and thus, the HF gas remaining in the process chamber 201 which does not react or remains after the removal of the modified deposit, or the reaction byproducts can be more effectively removed from the process chamber 201.

As the etching gas, an F-containing gas such as a fluorine ($F_2$) gas, a nitrogen fluoride ($NF_3$) gas or a chlorine fluoride ($ClF_3$) gas, in addition to the HF gas, may be used. Alternatively, a plurality of combinations of several gases described above, for example, adding an $F_2$ gas to the HF gas, may be used. As the etching gas, an F-containing gas added with a gas that does not contain F (F non-containing gas), for example, the O-containing gas as described above, may be also used. By using these, the cleaning rate can be further improved. As the inert gas, various types of rare gases as described above by way of example, in addition to the $N_2$ gas, may be used.

(Return to Atmospheric Pressure)

After the interior of the process chamber 201 is purged using an inert gas, the valves 243i to 243l are still opened to continuously supply the $N_2$ gas as an inert gas into the process chamber 201 from each of the gas supply pipes 232i to 232l. Thus, an atmosphere in the process chamber 201 is substituted with the inert gas (inert gas substitution) and the internal pressure of the process chamber 201 returns to normal pressure (return to atmospheric pressure)

(Boat Unloading)

Thereafter, the seal cap 219 is lowered by the boat elevator 115 to open the lower end of the manifold 209, and the empty boat 217 is unloaded to the outside of the reaction tube 203 through the lower end of the manifold 209 (boat unloading).

(4) Effects of the Embodiment

According to this embodiment, one or more effects are provided as described below.

(a) According to the cleaning sequence of this embodiment, a modifying gas is supplied into the process chamber 201 in Step 1b. Thus, the deposits deposited on the surfaces of the members in the process chamber 201 are modified, and thus, the deposits may be effectively removed in the following Step 2b.

When the foregoing film forming process (batch process) is performed a predetermined number of times, the foregoing deposits are deposited on the members in the process chamber. For example, when a thickness of the deposits exceeds a predetermined value, a portion of the deposits may peel and fall to cause particles. In order to solve this problem, a cleaning process of supplying an etching gas such as an F-containing gas into the process chamber to remove the deposits deposited on the members in the process chamber and prevent the generation of particles may be performed.

However, the deposits deposited on the members in the process chamber while the SiOC film having high etching resistance is formed may also have a high resistance to the etching gas such as the F-containing gas, for example, and thus it may be hard to remove the deposits by a cleaning process. In particular, in the region other than the wafer arrangement region, since the deposits are deposited to be thick while maintaining high C concentration as described above, it may be further difficult to remove the deposits through a cleaning process. Due to this, the cleaning efficiency may be degraded, and in some cases, the deposits may not be completely removed.

In this embodiment, by modifying the deposits in Step 1$b$, the SiOC film included in the deposits may be changed into an SiOC film having low C concentration, relative to the SiOC film at least prior to the modification. Thus, the resistance of the deposits to the F-containing gas may be lowered, and the deposits may be effectively removed in Step 2$b$. When the C concentration in the modified deposits is below the impurity level, a removal rate (cleaning rate) of the deposits in Step 2$b$ may be increased to be almost equal to a removal rate of deposits that does not contain C.

As in this embodiment, in the example in which the O-containing gas, for example, an $O_2$ gas, as a modifying gas is excited to a plasma state and supplied into the process chamber 201, the deposition film oxidized by the thermochemical reaction while the SiOC film is being formed may be more oxidized by the active species having higher energy through a plasma chemical reaction (plasma processing). Thus, at least a portion of C may be desorbed from the deposits and the deposits may be modified to a state in which C concentration is low and an oxidation degree has further progressed. Accordingly, the deposits may be effectively removed, and the cleaning time may be shortened to thereby enhance cleaning efficiency. Moreover, particles in the process chamber 201 can be reduced to prevent the attachment of particles onto the wafer 200.

The $O_2$ gas excited to a plasma state is known to be effective in etching removal of an organic compound such as, for example, a polymer having a C—C bonding or the like. However, the deposits in this embodiment have an inorganic compound having an Si—C bonding as a main constituent. Also, a removal target in Step 1$b$ is C contained in the inorganic compound having an Si—C bonding in the deposits. In Step 1$b$, C in the deposits is removed by the foregoing mechanism which is different from the etching removal of the organic compound by the $O_2$ gas, rather than removing the depositions itself, for example. In this manner, first, the deposits are modified by removing C therefrom in Step 1$b$, and then the modified deposits are removed by the HF gas in Step 2$b$.

(b) According to the cleaning sequence of this embodiment, in Step 2$b$, the HF gas is supplied into the process chamber 201 to remove the modified deposits through thermochemical reaction. Since the deposits have been modified in Step 1$b$, C concentration in the deposits has been lowered than that of the deposits prior to the modification. Thus, even under a non-plasma atmosphere, for example, the deposits may be removed at a high cleaning rate (etching rate), while preventing residual of the deposits. In this manner, by removing the deposits through thermochemical reaction under a non-plasma atmosphere, the reaction by the HF gas may progress relatively smoothly, thereby removing the deposits while preventing damage to the respective members in the process chamber 201. Thus, damage to the members in the process chamber 201 can be reduced, thereby prolonging the lifespan of the members.

(c) According to the cleaning sequence of this embodiment, in Step 2$b$, the internal temperature of the process chamber 201 is set to fall within a range of room temperature to 200 degrees C., specifically, room temperature to 150 degrees C., and more specifically, room temperature to 100 degrees C. Accordingly, the moisture may be released from the deposits while preventing peel and fall of the deposits, and thus the thermochemical reaction to remove the deposits may be made while preventing generation of particles. Also, the internal temperature of the process chamber 201 in the cleaning process may be equal to the temperature of the wafer 200 in the film forming process. In this case, since there is no need to change a temperature, i.e., raising or lowering the temperature, between the film forming process and the cleaning process, the overall cleaning time may be shortened. Accordingly, the operation stop time of the substrate processing apparatus can be reduced, thereby enhancing productivity of the apparatus.

(d) According to the cleaning sequence of this embodiment, the HF gas is supplied into the process chamber 201 by the nozzle 249$d$ configured as a short nozzle. Accordingly, the HF gas may be injected to a relatively lower side in the process chamber 201, which is the region other than the wafer arrangement region and a region in the vicinity of the furnace port. Thus, removal of the deposits deposited on the members in the region other than the wafer arrangement region is further accelerated.

(e) According to the cleaning sequence of this embodiment, by supplying the HF gas by the nozzle 249$d$ configured as a short nozzle, a flow path of the HF gas within the nozzle 249$d$ can be shortened, thereby reducing damage to the nozzle 249$d$ by the HF gas and prolonging the lifespan of the nozzle 249$d$.

(f) According to the cleaning sequence of this embodiment, the HF gas may be supplied into the process chamber 201 through the nozzle 249$a$ for supplying the BTCSM gas. Thus, even if the Si-containing layer containing C and Cl is formed within the nozzle 249$a$ while the BTCSM gas is supplied, it can be removed.

(g) According to the cleaning sequence of this embodiment, the HF gas may be supplied into the process chamber 201 without using the nozzles 249$b$ and 249$c$. Thus, damage to the nozzles 249$b$ and 249$c$ due to the HF gas can be prevented, thereby prolonging the lifespan of the nozzles 249$b$ and 249$c$. Also, as illustrated in FIG. 1, the substrate processing apparatus according to this embodiment is configured to allow the HF gas to be supplied even through the nozzles 249$b$ and 249$c$. Thus, it is possible to secure a degree of freedom of the apparatus management when gas species is added, replaced, or the like.

(h) According to the cleaning sequence of this embodiment, in Step 1$a$ of the process of forming the SiOC film, the BTCSM gas is supplied as a precursor gas to the wafer 200. Thus, by using the precursor gas containing Si, C and Cl and having an Si—C bonding, in particular, by using the precursor gas containing C, Cl and at least two Si in one molecule and having an Si—C bonding, the film having high C concentration, i.e., the SiOC film, may be formed. Also, the C concentration in the SiOC film may be controlled with high precision. Thus, an SiOC film having, for example, a high etching resistance and a low dielectric constant can be obtained.

As in this embodiment, in a case of forming a thin film such as the SiO film by using a catalytic gas under a low temperature condition below 200 degrees C., for example, a film having a high wet etching rate (hereinafter, also referred to as WER) with respect to hydrofluoric acid having 1% concentration (1% HF aqueous solution) or the like, i.e., a film having a low etching resistance, may be formed. An etching resistance of a film may be increased if C is contained in the film, but it is difficult to introduce C into the SiO film under a low temperature condition.

In this embodiment, the BTCSM gas is used as a precursor gas. By using the BTCSM gas, C may be introduced into the first layer while the Si—C bonding in the BTCSM gas is maintained in the step of forming the first layer as an initial layer on the wafer 200. Thus, the SiOC film having sufficient C concentration can be formed. Also, the C concentration in the SiOC film can be controlled with high precision. Thus, an SiOC film having, for example, a high etching resistance and a low dielectric constant can be obtained.

(i) The substrate processing apparatus according to this embodiment may have a plurality of gas supply lines for each of gases such as a precursor gas, a catalytic gas, an O-containing gas, a F-containing gas and the like, or may be configured such that a specific gas among a plurality of types of gases having different molecular structures may be selectively supplied. With this configuration, it is easy to selectively supply a specific precursor gas, catalytic gas, O-containing gas, or F-containing gas among the plurality of types of gases according to a desired film composition or the like. Thus, thin films having various composition ratios and film qualities can be formed with high versatility and high reproducibility in one substrate processing apparatus. Also, it is possible to secure a degree of freedom of the apparatus management when gas species is added, replaced, or the like.

(j) In the substrate processing apparatus according to this embodiment, a plurality of process recipes for use in forming a thin film such as the foregoing C-containing film, or a plurality of cleaning recipes (programs describing processing order or processing conditions) for use in cleaning the interior of the process chamber 201 after the film formation may be prepared in advance for every type of gas, i.e., for each of different gas systems. Also, in the substrate processing apparatus according to this embodiment, a plurality of process recipes or cleaning recipes may be prepared for each of different processing conditions. With this configuration, it is facilitated to selectively supply a specific precursor gas, catalytic gas, O-containing gas, F-containing gas and the like, among a plurality of types of gases according to a desired film composition or the like. An operator has only to appropriately select a suitable process recipe or cleaning recipe among the plurality of process recipes or cleaning recipes according to a desired film composition and perform the film forming process or the cleaning process. Therefore, thin films having a variety of composition ratios and film qualities can be formed with high versatility and high reproducibility in one substrate processing apparatus. In addition, since an operator's work load (a load of inputting processing procedures or processing conditions, or the like) can be reduced, it is possible to rapidly initiate the substrate processing while avoiding an operational error.

(5) Modification of the Embodiment

Next, a modification of the embodiment will be described with reference to FIG. 8B.

In the foregoing cleaning process, the example in which the cycle including Step 1b and Step 2b is performed only once has been mainly described, but the embodiment is not limited thereto. For example, the cycle including Step 1b and Step 2b may be performed repeatedly multiple times.

In a cleaning process of the modification, a cycle including: a process of exciting an $O_2$ gas, as a modifying gas, to a plasma state and supplying the same into the process chamber 201 after the SiOC film forming process is performed, to modify deposits including the SiOC film deposited on the surfaces of the members in the process chamber 201; and a process of supplying an HF gas as an etching to remove the modified deposits through a thermochemical reaction, is performed a predetermined number of times (n times), for example, multiple times. Processing conditions at this time may be the same as those in Steps 1b and 2b as described above.

By alternately repeating the process of lowering C concentration in the deposits by modifying the deposits using the $O_2$ gas, and the process of removing the deposits, which has been modified by the $O_2$ gas, using the HF gas, the deposits may be more easily removed, relative to the foregoing sequence in which the cycle is performed only once.

That is, even though the modification effect of the deposits using the $O_2$ gas is restrictive, i.e., limited to a surface layer portion of the deposits, the modified surface layer portion of the deposits are removed by the HF gas and then the exposed non-modified portion of the deposits may be further modified by the $O_2$ gas. By repeating this, the deposits may be more reliably removed without leaving residue. Also, rather than modifying the entirety of the deposits in a one-time $O_2$ gas supply process, gradually modifying the deposits by a predetermined depth and removing the modified portion of the deposits for every $O_2$ gas supply time may shorten the overall $O_2$ gas supply and cleaning process time. In particular, in a case where deposits are relatively thick, for example, the method of the modification in which the cycle is repeatedly performed multiple times is effective. Thus, cleaning efficiency may be further enhanced.

<Second Embodiment>

Hereinafter, a second embodiment of the present disclosure will be described.

(1) Cleaning Process

In the foregoing embodiment, the example in which the internal pressure of the process chamber 201 is uniform when the HF gas is supplied into the process chamber 201 in the cleaning process of Step 2b has been described. The present embodiment is different from the foregoing embodiment in that the internal pressure of the process chamber 201 is varied when the HF gas is supplied into the process chamber 201. In this embodiment, the substrate processing apparatus illustrated in FIGS. 1 and 2 are also used, like the foregoing embodiment. In the following description, operations of the respective components constituting the substrate processing apparatus are controlled by the controller 121.

Figure 9:
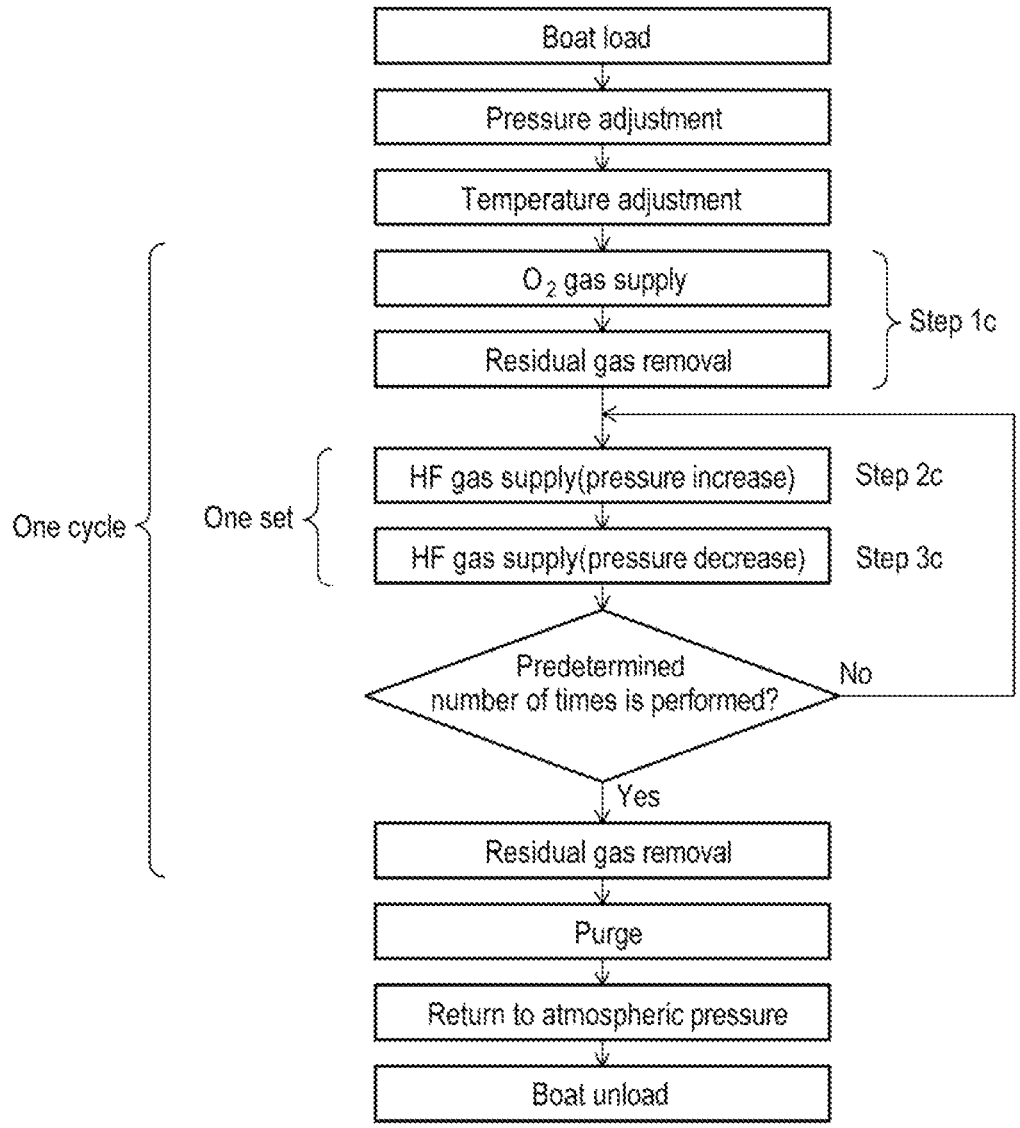
FIG. 9 is a view illustrating a cleaning flow in a cleaning sequence according to a second embodiment of the present disclosure.
Figure 10:
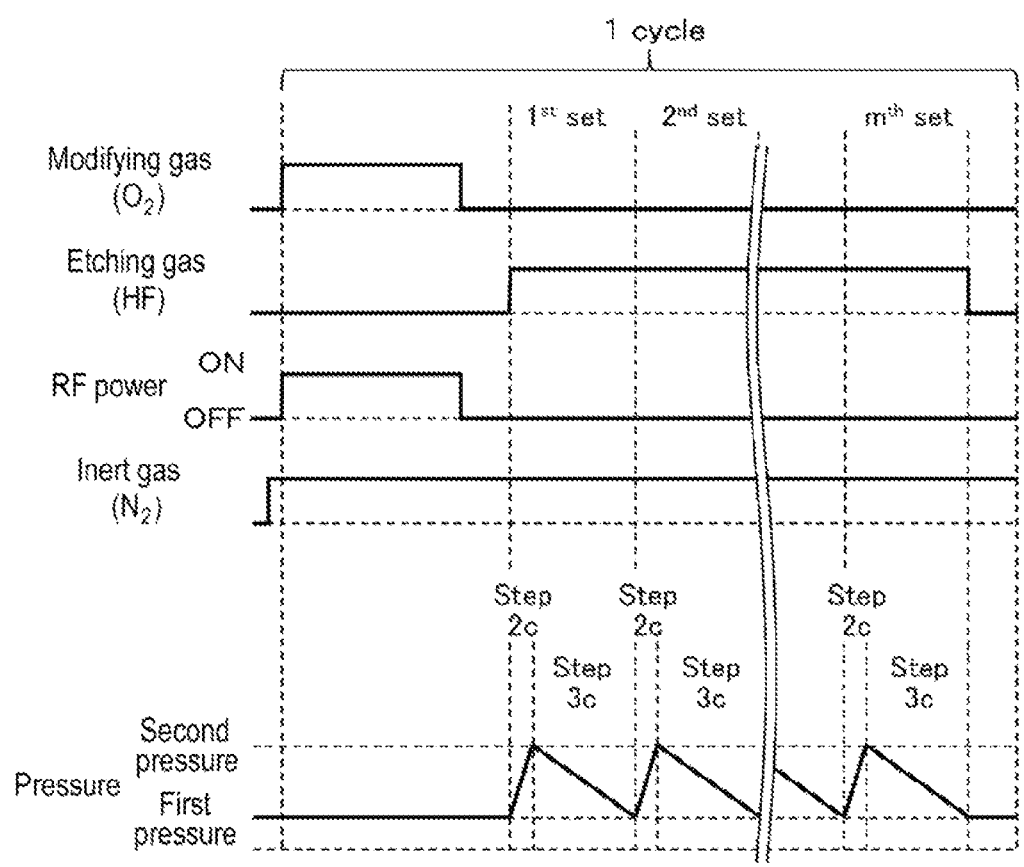
FIG. 10 is a view illustrating timings of gas supply, RF power supply and pressure change in the cleaning sequence according to the second embodiment of the present disclosure.

As illustrated in FIGS. 9 and 10, in the embodiment, an example, in which a cycle including: a process of exciting an $O_2$ gas as a modifying gas into a plasma state and supplying the same into the process chamber 201 to modify deposits including an SiOC film deposited on surfaces of members in the process chamber 201 (Step 1c); and a process of supplying an HF gas as an etching gas into the process chamber 201 to remove the modified deposits through a thermochemical reaction, is performed a predetermined number of times, for example, once, wherein, in the process of supplying the HF gas, while the supply of the HF gas into the process chamber 201 is maintained, a set including: a process of changing the internal pressure of the process chamber 201 from a first pressure zone to a second pressure zone (Step 2c); and a process of changing the internal pressure of the process chamber 201 from the second pressure zone to the first pressure zone (Step 3c), is performed a predetermined number of times, will be described.

In the process of supplying the HF gas, in some embodiments, when the internal pressure of the process chamber 201 is changed to the second pressure zone and then changed to the first pressure zone, the internal pressure of the process chamber 201 is not maintained at the second pressure zone, and when the internal pressure of the process chamber 201 is changed to the first pressure zone and then changed to the second pressure zone, the internal pressure of the process chamber 201 is not maintained at the first pressure zone.

In this embodiment, an SiOC film forming process may be performed, for example, like the SiOC film forming process of the foregoing embodiment. Also, in this embodiment, Step 1c in the cleaning process may be performed, for example, like Step 1b of the foregoing embodiment. Thus, a difference of this sequence from the sequence of the foregoing embodiment is only Steps 2c and 3c in which the HF gas is supplied while the internal pressure of the process chamber 201 varies. Hereinafter, Steps 2c and 3c of this embodiment will be mainly described.

(HF Gas Supply)

After Step 1c is terminated, an HF gas as an etching gas and an $N_2$ gas as an inert gas are supplied into the process chamber 201, like the HF gas supply in Step 2b of the foregoing embodiment. The supply of the HF gas and the $N_2$ gas into the process chamber 201 is continuously performed in a state where uniform flow rates thereof are maintained at least until the cleaning process is terminated.

[Step 2c]
(Pressure Increase)

While the supply of the HF gas and the $N_2$ gas at uniform supply flow rates is maintained as described above, the APC valve 244 is appropriately controlled to change the internal pressure of the process chamber 201 from a first pressure as a predetermined pressure included in the first pressure zone to a second pressure as a predetermined pressure included in the second pressure zone. A pressure range of the first pressure zone is set to fall within a range of, for example, 13 to 2666 Pa (0.1 to 20 Torr) and the first pressure is set to be, for example, 133 Pa (1 Torr). A pressure range of the second pressure zone is set to fall within a range of, for example, 5320 to 13330 Pa (40 to 100 Torr) and the second pressure is set to be, for example, 6650 Pa (50 Torr). In order to change the internal pressure of the process chamber 201 in this way, an opening degree of the APC valve 244 is controlled to be decreased (changed in a direction to close the valve) to reduce exhaust flow rates of the HF gas and the $N_2$ gas through the exhaust pipe 231, so that the internal pressure of the process chamber 201 is increased from the first pressure (low pressure) to the second pressure (high pressure), while feeding-back internal pressure information of the process chamber 201 detected by the pressure sensor 245. Here, the opening degree of the APC valve 244 is controlled such that a time taken for changing the internal pressure of the process chamber 201 from the first pressure to the second pressure is, for example, 1 to 180 seconds, in some embodiments, 50 to 70 seconds.

[Step 3c]
(Pressure Decrease)

When the internal pressure of the process chamber 201 reaches the second pressure, the APC valve 244 is appropriately controlled while continuously maintaining the supply of the HF gas and the $N_2$ gas at uniform supply flow rates, to thereby change the internal pressure of the process chamber 201 from the second pressure included in the second pressure zone to the first pressure included in the first pressure zone. In order to change the internal pressure of the process chamber 201 in this manner, when it is detected by the pressure sensor 245 that the internal pressure of the process chamber 201 has reached the second pressure, the opening degree of the APC valve 244 begins to be increased (changed in a direction to open the valve). Also, by increasing the opening degree of the APC valve 244, exhaust flow rates of the HF gas and the $N_2$ gas through the exhaust pipe 231 are increased, so that the internal pressure of the process chamber 201 is controlled to be decreased from the second pressure (high pressure) to the first pressure (low pressure), while feeding-back the internal pressure information of the process chamber 201 detected by the pressure sensor 245. Here, the opening degree of the APC valve 244 is controlled such that a time taken for changing the internal pressure of the process chamber 201 from the second pressure to the first pressure is, for example, 1 to 180 seconds, preferably, 80 to 100 seconds.

In Step 3c, when the internal pressure of the process chamber 201 reaches the second pressure, in some embodiments, the internal pressure of the process chamber 201 is changed immediately to the first pressure zone, rather than being maintained in the second pressure zone. Also, in Step 2c performed thereafter, when the internal pressure of the process chamber 201 is changed from the first pressure to the second pressure, in some embodiment, the internal pressure of the process chamber 201 is changed to the second pressure zone, rather than being maintained in the first pressure zone.

The region other than the wafer arrangement region as described above has a structure in which gaps between respective members are narrowly intertwined. Thus, although thick and firm deposits may be readily deposited on the members positioned in the region other than the wafer arrangement region, an etching gas such as an HF gas cannot easily go into the gaps. However, by alternately repeating Step 2c and Step 3c as described above, the internal pressure of the process chamber 201 may fluctuate up and down and the HF gas may easily go into such narrow gaps, thereby further enhancing the cleaning efficiency. Here, as illustrated in FIG. 10, by setting a pressure increase time to be short and a pressure decrease time to be long, the cleaning efficiency can be further enhanced.

In both of Step 2c and Step 3c, processing conditions other than the internal pressure of the process chamber 201 and the supply time of the HF gas, i.e., the supply flow rates of the HF gas and the $N_2$ gas, the internal temperature of the process chamber 201 and the like, may be set within the same range as that of the processing conditions in the cleaning sequence of the foregoing embodiment. Also, like the foregoing embodiment, in supplying each gas, the supply of $N_2$ gas for preventing infiltration of a gas into the nozzles 249b and 249c, which are not in use, and the buffer chamber 237 is appropriately performed.

(Performing Predetermined Number of Times)

By taking the foregoing Steps 2c and 3c as one set and performing this set a predetermined number of times, the deposits on the respective members in the process chamber 201 may be almost completely removed. In some embodiments, the set may be performed multiple times, for example, 20 to 50 times. In other words, the foregoing set may be performed multiple times until the deposits on the respective members in the process chamber 201 are almost completely removed.

In the above description, the processing order of Step 2c (pressure increase) and Step 3c (pressure decrease) may be arbitrary. Time durations of Step 2c and of Step 3c may be appropriately adjusted, so that they may be set to be equal or one of them may be set to be longer than the other. Pressure change slopes in Step 2c and Step 3c may be appropriately changed by adjusting the time durations of Step 2c and Step 3c and the difference between the lowest pressure and the highest pressure in each of Step 2c and Step 3c. The first pressure or the second pressure may be changed within the pressure range of each pressure zone, while Step 2c and Step 3c are repeatedly performed multiple times. The internal pressure of the process chamber 201 may be changed in a non-linear manner.

(Residual Gas Removal)

Thereafter, like Step 2b of the foregoing embodiment, the supply of the HF gas is stopped, and a residual gas is removed from the process chamber 201. In addition, the purging, returning to atmospheric pressure and boat unloading are performed in the same order as that of the foregoing embodiment to thereby terminate the cleaning process of this embodiment.

The example in which the cycle including Step 1c to Step 3c is performed only once has been mainly described so far, but the cycle may be repeatedly performed multiple times. In this case, for example, a sequence may be configures so that a flow of performing Step 1c once and performing Steps 2c and 3c multiple times is repeated multiple times.

(2) Effects of the Embodiment

According to this embodiment, in addition to the same effects as those of the first embodiment described above, one or more effects are provided as described below.

(a) According to the cleaning sequence of this embodiment, in Step 3c, the internal pressure of the process chamber 201 is changed from the second pressure (high pressure) to the first pressure (low pressure). Accordingly, the HF gas may easily go into even the narrow gaps in the region other than the wafer arrangement region, whereby the efficiency of cleaning the deposits on the members positioned in the region other than the wafer arrangement region can be enhanced, and thus, the deposits can be more reliably removed.

The members positioned in the region other than the wafer arranged region as described above, i.e., the inner wall in the vicinity of the lower end of the reaction tube 203, the inner wall of the manifold 209, the lower portion of each of the nozzles 249a to 249d, the lower portion of the buffer chamber 237, the upper surface of the seal cap 219, the lateral surface of the rotary shaft 255, the heat insulating plates 218, and the like are disposed with relatively narrow intertwined gaps therebetween. Thus, it may be difficult for the HF gas to go into the gaps, and the cleaning efficiency with respect to the surfaces of the members positioned in the region other than the wafer arrangement region may be degraded relative to the surfaces of members positioned in the wafer arrangement region. Also, the deposits on the members positioned in the region other than the wafer arrangement region are thicker and have higher C concentration than those on the members positioned in the wafer arrangement region, which may be hard to be removed.

The HF gas or the like flows various paths in the process chamber 201 toward the exhaust pipe 231 through the gas supply holes 250a to 250d of the nozzles 249a to 249d. The quantity of such gas flows may be expressed by a mole flow rate. The mole flow rate refers to a mole number of a gas that passes a unit area per unit time, and may be expressed by a unit such as "$kmol/m^2 \cdot s$", for example. That is, the mole flow rate refers to a physical quantity obtained by converting a mole number of a gas (here, HF gas or $N_2$ gas) that passes through a sectional area of a predetermined path (gas flow path) per unit time into a unit area. It is thought that, if a mole flow rate of the HF gas or the like is increased, gas flows in the process chamber 201 may be increased to thereby enhance the cleaning efficiency.

The mole flow rate is proportional to a pressure difference between an upstream end and a downstream end of a gas flow path, and is in inverse proportion to flow resistance in the gas flow path. Here, the upstream end of the gas flow path of the HF gas or the like may be considered the gas supply holes 250a to 250d of the nozzles 249a to 249d, and the downstream end thereof may be considered the exhaust pipe 231. When a supply flow rate of a gas is constant and the internal pressure of the process chamber 201 is uniform, it may be considered that the supply flow rate and an exhaust flow rate of the gas are almost equal. In this embodiment, it is considered that a pressure difference in the gas flow path is small and does not severely fluctuate so that a mole flow rate of the gas is stabilized as a low value.

The mole flow rate is affected even by a flow resistance. The flow resistance in a gas flow path is increased by various factors that may hinder a gas flow, for example, a surface roughness of each member in the process chamber 201, a curvature or angle of a corner portion, and a diameter of the path (a sectional area of the gas flow path). For example, it is considered that in the region other than the wafer arrangement region where the gaps are relatively narrow and intertwined, the flow resistance is increased so that the mole flow rate of the gas is further lowered.

In this embodiment, when the internal pressure of the process chamber 201 is lowered in Step 3c, the exhaust flow rates of the HF gas and the $N_2$ gas through the exhaust pipe 231 may be increased, while the supply flow rates thereof are kept constant. Thus, the pressure at the exhaust pipe 231 is decreased relative to the nozzle 249d or the like, thereby increasing the pressure difference and increasing the mole flow rate of the HF gas or the like in each path. The flow of the HF gas having the increased mole flow rate is accelerated in momentum, so that the HF gas is evenly spread to each portion in the process chamber 201 including the region other than the wafer arrangement region, as well as the wafer arrangement region. Thus, since the HF gas may readily go into the narrow gaps or the like in the region other than the wafer arrangement region, the cleaning efficiency of the deposits deposited on the members positioned in the region other than wafer arrangement region can be further enhanced.

(b) According to the cleaning sequence of this embodiment, in Step 2c, even while the internal pressure of the process chamber 201 is changed from the first pressure (low pressure) to the second pressure (high pressure), at least the deposits deposited on the members positioned in the wafer arrangement region can be removed. That is to say, the internal pressure of the process chamber 201 may be increased in Step 2c as a preprocessing step of Step 3c, and also the deposits deposited on some members can be continuously removed in Step 2c, whereby the cleaning can be further effectively performed.

(c) According to the cleaning sequence of this embodiment, by alternately repeating Steps 2c and 3c, a difference in cleaning rates (etching rates) between the region other than the wafer arrangement region and the wafer arrangement region is reduced. Accordingly, since an overall cleaning rate of the deposits is enhanced, a cleaning time can be shortened and thus cleaning can be effectively performed. Thus, the deposits in the process chamber 201 can be more reliably removed. Also, since the difference in cleaning rates between the region other than the wafer arrangement region and the wafer arrangement region is reduced, excessive overetching on the members in the wafer arrangement region can be prevented until the deposits in the region other than the wafer arrangement region is completely removed. Thus, damage to the members can be reduced and the lifespan of the members can be prolonged.

(d) According to the cleaning sequence of this embodiment, the internal pressure of the process chamber 201 is changed, rather than being maintained at a predetermined pressure. Thus, a time during which the pressure needs not be maintained can be omitted and the number of times of repeating the respective Steps 2c and 3c can be increased, whereby a cleaning time can be further shortened and the cleaning can be more effectively performed. Accordingly, an operation stop time of the substrate processing apparatus can be shortened.

(e) According to the cleaning sequence of this embodiment, a pressure increase time in Step 2c is set to be short and a pressure decrease time in Step 3c is set to be long. Accordingly, a ratio of the time duration of Step 3c within a predetermined cleaning time can be increased, during which the deposits on the members in the region other than the wafer arrangement region can be removed, and thus the cleaning can be more effectively performed.

<Other Embodiments>

While the embodiments of the present disclosure have been described in detail so far, the present disclosure is not limited to the foregoing embodiments or modifications but may be variously modified without departing from the spirit of the present disclosure.

In the foregoing embodiments or modifications, the example in which the SiOC film is formed under a low temperature condition by supplying a catalytic gas together with a precursor gas or an oxidizing gas has been described, but the configuration of the present disclosure is not limited thereto. For example, without using a catalytic gas, an $O_2$ gas or the like as an oxidizing gas may be excited to a plasma state and supplied to the wafer 200 in a state where the oxidizing power thereof is enhanced. In this case, however, in order to prevent C from being desorbed from the SiOC film, the high-frequency power needs to be low so that the oxidation reaction progresses smoothly.

In the foregoing embodiments, the example in which the deposits in the process chamber 201 are removed through cleaning after forming the SiOC film has been described, but the configuration of the present disclosure is not limited thereto. For example, after forming the SiOC film, annealing may be performed by increasing a temperature of the wafer 200. By doing this, the SiOC film may be modified into a high quality film which is denser and has high etching resistance against HF. Meanwhile, since the deposits in the process chamber 201 may also be modified to have high etching resistance through the annealing processing, it may be difficult to remove the deposits through cleaning using the HF gas. Even in this case, according to the present disclosure, since the deposits are modified by the modifying gas such as plasma-excited $O_2$ gas and etched by using the HF gas, the deposits may be relatively easily removed from the process chamber 201.

The annealing process as described above may be performed after the process of forming the SiOC film by thermally treating the SiOC film at a temperature higher than a temperature of the wafer 200 in the process of forming the SiOC film. Specifically, a temperature of the wafer 200 is set to fall within a range of, for example, 200 degrees C. to 900 degrees C., in some embodiments, 200 degrees C. to 700 degrees C., and in some other embodiments, 200 degrees C. to 600 degrees C. Also, the internal pressure of the process chamber 201 is reduced to render the interior of the process chamber 201 placed under an atmosphere without containing oxygen. The time duration for the thermal treatment is set to fall within a range of, for example, 1 to 120 minutes, in some embodiments, 10 to 120 minutes. Thus, the moisture or at least a portion of impurities such as Cl or the like may be removed from the SiOC film, thereby obtaining a thin film having a higher etching resistance and a lower dielectric constant.

During the thermal treatment, a predetermined gas may be supplied into the process chamber 201. In this case, the internal pressure of the process chamber 201 may be set to fall within a range of, for example, 133 to 101325 Pa, in some embodiments, 10132 to 101325 Pa, and a supply flow rate of the predetermined gas may be set to fall within a range of, for example, 100 to 10000 sccm. As the predetermined gas, for example, an inert gas such as $N_2$ gas, a carbon-containing gas such as propylene ($C_3H_6$) gas, a nitrogen-containing gas such as $NH_3$ gas may be used. By using a carbon-containing gas or nitrogen-containing gas as the predetermined gas, C or N may be contained in (or added to) the SiOC film, and thus higher C concentration in the thin film may be maintained or desorption of C from the thin film may be prevented.

In the foregoing embodiments, in the cleaning process, the example in which the $O_2$ gas or the HF gas is supplied into the process chamber 201 has been described, but, for example, a supply pipe for supplying the HF gas may be connected to the exhaust pipe 231 so that the HF gas may be directly supplied into the exhaust pipe 231. With this configuration, the deposits in the exhaust pipe 231 where the deposition are readily deposited may be reliably removed at a further low temperature, relative to that of the process chamber 201. Similarly, a supply pipe for supplying an $O_2$ gas may be connected to the exhaust pipe 231 so that the $O_2$ gas may be directly supplied into the exhaust pipe 231. In this case, if a remote plasma unit or the like is installed separately, the $O_2$ gas in a plasma state may reach the exhaust pipe 231 more reliably.

In the foregoing embodiments, in the cleaning process, the example in which the $O_2$ gas is excited by using an assist gas has been described. In this case, a nozzle for supplying the $O_2$ gas may be installed separately from a nozzle for supplying the assist gas. Further, the nozzle for supplying the $O_2$ gas may be installed outside of the buffer chamber 237. Even with this configuration, the $O_2$ gas supplied into the process chamber 201 may be excited to a plasma by the assist gas supplied into the process chamber 201 in a plasma state through the gas supply holes 250e.

In the foregoing embodiments, in the cleaning process, the example in which C in the deposits is desorbed by the $O_2$ gas excited to a plasma state has been described, but here, plasma may not be used. In this case, an active gas having high oxidizing power, for example, an $H_2O_2$ gas or an $O_3$ gas, may be used to desorb C from the deposits. Also, an O-containing gas such as an $O_2$ gas and an H-containing gas such as an $H_2$ gas may be used together, as the gas having high oxidizing power.

In the foregoing embodiments, in the cleaning process, the example in which the O-containing gas, such as the $O_2$ gas, as a modifying gas is excited to a plasma state and supplied has been described, but an available modifying gas is not limited thereto. As the modifying gas, for example, a reduction gas such as a hydrogen-containing (H-containing) gas may be excited to a plasma state and supplied, or an inert gas or the like may be excited to a plasma state and supplied. The H-containing gas may include, for example, a hydrogen ($H_2$) gas, a deuterium ($D_2$), an $NH_3$ gas and the like. Active species such as H radicals (H*) contained in the H-containing gas and C in the deposits including the SiOC film react with each other, so that C as a $C_xH_y$ component such as $CH_2$ is desorbed from the deposits. The inert gas may include, for example, a rare gas such as $N_2$ gas, Ar gas, He gas, Ne gas or Xe gas.

In the second embodiment described above, in the cleaning process, the example in which the internal pressure of the process chamber 201 is changed in the HF gas supply process has been described, but the internal pressure may also be changed in the $O_2$ gas supply process. With this configuration, the $O_2$ gas may be evenly spread to the respective portions in the process chamber 201, and the deposits on the members positioned in the region other than the wafer arrangement region may be more reliably oxidized so as to be easily removed.

In the foregoing embodiments, the example in which the SiOC film is formed by using the BTCSM gas has been described, but the SiOC film may also be formed by using a precursor gas that does not contain C and a carbon-containing gas as a carbon source separately prepared from the precursor gas. As the precursor gas that does not contain C, for example, a hexachlorodisilane ($Si_2Cl_6$, abbreviation: HCDS) gas, a trichlorosilane ($SiHCl_3$, abbreviation: TCS) gas, a silicontetrachloride ($SiCl_4$, abbreviation: STC) gas, a dichlorosilane ($SiH_2Cl_2$, abbreviation: DCS) gas, a monochlorosilane ($SiH_3Cl$, abbreviation: MCS) gas, or the like may be used. As the carbon-containing gas as a carbon source, an amine-based gas such as a triethylamine [$(C_2H_5)_3N$] gas, a diethylamine [$(C_2H_5)_2NH$] gas, a monoethylamine [$(C_2H_5)NH_2$] gas, a trimethylamine [$(CH_3)_3N$] gas, or a monomethylamine [$(CH_3)NH_2$] gas, a hydrocarbon-based gas such as a propylene ($C_3H_6$) gas, an ethylene ($C_2H_4$) gas, or a methane ($CH_4$) gas, or a monomethylsilane ($CH_3SiH_3$) gas, or the like may be used.

In the foregoing embodiments, the cleaning sequence example in which the interior of the process chamber 201 is cleaned after the SiOC film is formed has been described, but the cleaning sequence of the foregoing embodiments may also be applied after a different Si-based thin film containing C is formed. The Si-based thin film containing C may include, for example, a silicon carbide (SiC) film, a silicon carbonnitride (SiCN) film, a silicon oxycarbide nitride (SiOCN) film, and the like. The Si-based thin film containing C may be a multi-layered film including two or more types of carbon-containing films. Such a multi-layered film may be, for example, a stacked film of an SiOC film and an SiOCN film or a stacked film of an SiOC film and an SiCN film. Alternatively, the multi-layered film may be a stacked film of one or more types of carbon-containing film as described above as an example and a thin film that does not contain carbon, such as an SiO film. In this case, the SiO film may be formed by using an HCDS gas or the like as a precursor gas and also by using an $H_2O$ gas, pyridine gas or the like.

By using the Si-based insulating film formed according to the foregoing embodiments or modifications as a side wall spacer, it is possible to provide a technique of forming a device having a small leakage current and excellent processibility.

In addition, by using the Si-based insulating film formed according to the foregoing embodiments or modifications as an etch stopper, it is possible to provide a technique of forming a device having excellent processibility.

According to the embodiments and modifications as described above, an Si-based film having an ideal stoichiometry ratio may be formed without using plasma. Thus, the present disclosure may be applied to a process involving potential plasma damage such as an SADP film of a DPT, for example.

The cleaning sequence of the foregoing embodiments, are not limited to the case for forming Si-based film films, but may also be applied to a case of forming a metal-based thin film, such as a metal carbide film or a metal oxycarbide that contains a metal element such as titanium (Ti), zirconium (Zr), hafnium (Hf), tantalum (Ta), aluminum (Al) or molybdenum (Mo), and C.

A plurality of process recipes used in forming a variety of the thin films or a plurality of cleaning recipes (programs with processing procedures or processing conditions written) for use in cleaning the interior of the process chamber 201 after the formation of the thin films may be individually prepared according to substrate processing or cleaning types (the type of film to be formed, a composition ratio, a film quality, a film thickness, a composition or thickness of deposits and the like). In addition, when the substrate processing or the cleaning is initiated, a suitable process recipe or cleaning recipe may be appropriately selected among the plurality of process recipes or cleaning recipes according to a substrate processing or cleaning type. Specifically, the plurality of recipes individually prepared according to processing types may be previously stored (installed) in the memory device 121c provided in the substrate processing apparatus through an electrical communication line or a recording medium (e.g., the external memory device 123) in which the recipes are recorded. In addition, when a specific process is initiated, the CPU 121a provided in the substrate processing apparatus may appropriately select a suitable recipe among the plurality of recipes stored in the memory device 121c according to a processing type. With this configuration, thin films having a variety of film types, composition ratios, film qualities and film thicknesses can be formed with high versatility and high reproducibility in one substrate processing apparatus. In addition, since an operator's work load (a load of inputting processing procedures or processing conditions, or the like) can be reduced, it is possible to rapidly initiate the substrate processing while avoiding an operational error.

Here, the above-described process recipe or cleaning recipe is not limited to a newly prepared recipe and may be prepared, for example, by modifying an existing recipe that is already installed in the substrate processing apparatus. When the recipe is modified, the modified recipe may be installed to the substrate processing apparatus through an electrical communication line or a recording medium in which the recipe is recorded. In addition, the recipe previously installed in the existing substrate processing apparatus may be directly changed by manipulating the input/output device 122 of the substrate processing apparatus.

Moreover, in the foregoing embodiments, a heating mechanism for heating the members in the region other than the wafer arrangement region, i.e., other than the region surrounded by the heater 207, may be installed separately in the vicinity of the furnace port, for example. In at least one of the SiOC film forming process and the cleaning process or in both processes, the region other than the wafer arrangement region may be heated to a temperature of, for example, about 90 degrees C. to 100 degrees C. in performing the process of forming the SiOC film and to a temperature of, for example, about 100 degrees C. in performing the cleaning process, by using the heating mechanism. Thus, an amount (thickness) of the deposits formed in the process of forming the SiOC film may be reduced and a cleaning rate of the deposits in the cleaning process may also be further enhanced, whereby the effect of the present disclosure may be further enhanced.

In the foregoing embodiments, the example in which a predetermined processing in various sequences is performed at room temperature has been described. In this case, the inside of the process chamber 201 need not be heated by the heater 207, so that the substrate processing apparatus may not be provided with the heater. Accordingly, the configuration of the heating system of the substrate processing apparatus can be simplified, so that the substrate processing apparatus may have a more inexpensive and simple configuration.

Moreover, while it has been described as an example in the above-described embodiments and the like that a batch type substrate processing apparatus in which a plurality of substrates are processed at a time is used, the present disclosure is not limited thereto but may be applied to a case in which a single-wafer type substrate processing apparatus in which one or several substrates are processed at a time is used. Although it has been described as an example in the above-described embodiments that the substrate processing apparatus having the hot wall type processing furnace is used, the present disclosure is not limited thereto but may be appropriately applied to a case in which a substrate processing apparatus having a cold wall type processing furnace is used.

The foregoing respective embodiments and modifications may be appropriately combined to be used.

EXAMPLES

As an example of the present disclosure and a comparative example, the interior of the process chamber 201 was cleaned after performing the process of forming an SiOC film on a wafer 200 by using the substrate processing apparatus according to the foregoing embodiments. The SiOC film was formed like the SiOC film forming process in the first embodiment as described above. Cleaning in the example was performed like the cleaning process in the first embodiment as described above. An $O_2$ gas was used as a modifying gas. An HF gas was used as an etching gas. In the cleaning process of the comparative example, only the etching gas supply process was performed by using the HF gas, like the cleaning process in the first embodiment as described above, without performing the modifying gas supply process. Cleaning rates in an upper portion, a middle portion, and a lower portion of the boat 217 were measured by using sample pieces disposed in the respective positions corresponding to these three portions of the boat 217.

Figure 11:
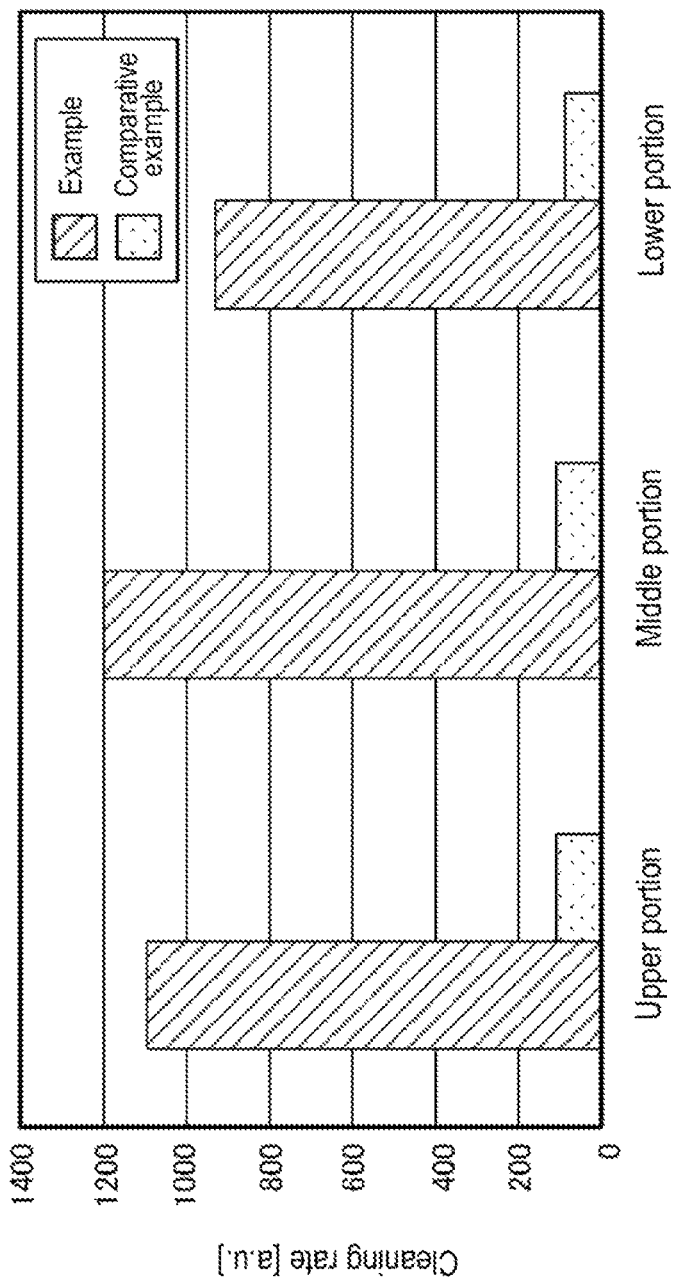
FIG. 11 is a graph illustrating cleaning rates according to an example of the present disclosure and a comparative example.

FIG. 11 is a graph showing cleaning rates in the example of the present disclosure and the comparative example. In the graph, the vertical axis represents cleaning rates (a.u.), and the horizontal axis represents respective portions (upper portion, middle portion, and lower portion) in the wafer arrangement region in the process chamber 201. The bar graphs with oblique lines show measurement results of the example of the present disclosure, and the graphs with dots show measurement results of the comparative example. According to FIG. 11, it can be seen that the cleaning rates in the example of the present disclosure are remarkably improved, in comparison to the comparative example. In the portion close to the region other than the wafer arrangement region (a lower portion of the wafer arrangement region), improvement in the cleaning rates of the example of the present disclosure is remarkable, relative to the comparative example. It is considered that, by performing the process of supplying the $O_2$ gas as a modifying gas, C was desorbed from the deposits, and thus, the deposits were modified into deposits that can be easily removed.

<Aspects of the Present Disclosure>

Hereinafter, some aspects of the present disclosure will be additionally stated.

(Supplementary Note 1)

According to an aspect of the present disclosure, there is provided a method for cleaning an interior of a process chamber after performing a process of forming a carbon-containing film on a substrate in the process chamber, by performing a cycle a predetermined number of times, the cycle including: supplying a modifying gas into the process chamber to modify deposits including the carbon-containing film deposited on a surface of a member in the process chamber; and supplying an etching gas into the process chamber to remove the modified deposits through a thermochemical reaction.

(Supplementary Note 2)

In the method according to Supplementary Note 1, in the act of supplying the modifying gas, at least a portion of carbon contained in the deposits is desorbed from the deposits, and in the act of supplying the etching gas, the deposits from which at least the portion of the carbon is desorbed is removed through the thermochemical reaction.

(Supplementary Note 3)

In the method according to Supplementary Note 1 or 2, in the act of supplying the modifying gas, the carbon contained in the deposits is desorbed from the deposits until a concentration of the carbon contained in the deposits becomes at least equal to or lower than an impurity level, and in the act of supplying the etching gas, the deposits in which the concentration of the carbon is at least equal to or lower than the impurity level is removed through the thermochemical reaction.

(Supplementary Note 4)

In the method according to any one of Supplementary Notes 1 to 3, in the act of supplying the modifying gas, at least a portion of carbon contained in the deposits is desorbed from the deposits without removing the deposits.

(Supplementary Note 5)

In the method according to any one of Supplementary Notes 1 to 4, the act of supplying the modifying gas is performed by supplying the modifying gas excited to a plasma state, and the act of supplying the etching gas is performed under a non-plasma atmosphere.

(Supplementary Note 6)

In the method according to any one of Supplementary Notes 1 to 5, in the act of supplying the modifying gas, the deposits are modified through a plasma chemical reaction (plasma processing).

(Supplementary Note 7)

In the method according to any one of Supplementary Notes 1 to 6, the carbon-containing film is an oxide film containing carbon (oxycarbide film), and/or the carbon-containing film is a film having an oxide film as a main constituent and is a film in which at least a portion of oxygen in the oxide film is substituted with carbon (oxycarbide film).

(Supplementary Note 8)

In the method according to any one of Supplementary Notes 1 to 7, the carbon-containing film is an oxide film containing carbon (oxycarbide film), and in the act of supplying the modifying gas, the oxide film containing the carbon (oxycarbide film) included in the deposits is modified into an oxide film without containing carbon or an oxide film containing carbon (oxycarbide film) having carbon concentration lower than that of the oxide film containing the carbon (oxycarbide film) included in the deposits.

(Supplementary Note 9)

In the method according to any one of Supplementary Notes 1 to 8, the carbon-containing film is an oxide film containing carbon (oxycarbide film) formed by performing a set a predetermined number of times, the set including: supplying a precursor gas containing silicon, carbon and a halogen element and having an Si—C bonding, and a first catalytic gas to the substrate; and supplying an oxidizing gas and a second catalytic gas to the substrate.

(Supplementary Note 10)

In the method according to Supplementary Note 9, the precursor gas contains at least one selected from the group consisting of an alkyl group and an alkylene group.

(Supplementary Note 11)

In the method according to Supplementary Note 10, the precursor gas containing the alkylene group contains at least one selected from the group consisting of an Si—C—Si bonding and an Si—C—C—Si bonding.

(Supplementary Note 12)

In the method according to any one of Supplementary Notes 9 to 11, each of the first and second catalytic gases includes at least one selected from the group consisting of an amine-based catalytic gas and a non-amine-based catalytic gas.

(Supplementary Note 13)

In the method according to any one of Supplementary Notes 1 to 12, the carbon-containing film is an oxide film containing carbon (oxycarbide film) formed by setting a temperature of the substrate to fall within a range from room temperature to 200 degrees C., in some embodiments, room temperature to 150 degrees C., and in some other embodiments, room temperature to 100 degrees C.

(Supplementary Note 14)

In the method according to any one of Supplementary Notes 1 to 13, the carbon-containing film is an oxide film containing carbon (oxycarbide film) obtained by thermal treatment, which is performed after performing a process of forming the carbon-containing film, at a temperature higher than a temperature of the substrate in the process of forming the carbon-containing film.

(Supplementary Note 15)

In the method according to any one of Supplementary Notes 1 to 14, the modifying gas includes at least one selected from the group consisting of an oxygen-containing gas, a hydrogen-containing gas and an inert gas, and the etching gas includes a fluorine-containing gas.

(Supplementary Note 16)

In the method according to any one of Supplementary Notes 1 to 15, the modifying gas includes at least one selected from the group consisting of an oxygen ($O_2$) gas, a carbon monoxide (CO) gas, a carbon dioxide ($CO_2$) gas, a nitrogen monoxide (NO) gas, a nitrous oxide ($N_2O$) gas, an ozone ($O_3$) gas, a hydrogen peroxide ($H_2O_2$) gas, a vapor ($H_2O$) gas, a hydrogen ($H_2$) gas, a deuterium ($D_2$) gas, an ammonia ($NH_3$) gas, a nitrogen ($N_2$) gas, an argon (Ar) gas, a helium (He) gas, a neon (Ne) gas and a xenon (Xe) gas, and the etching gas includes at least one selected from the group consisting of a hydrogen fluoride (HF) gas, a fluorine ($F_2$) gas, a nitrogen fluoride ($NF_3$) gas and a chlorine fluoride ($ClF_3$) gas.

(Supplementary Note 17)

In the method according to any one of Supplementary Notes 1 to 16, in each of the acts, the internal temperature of the process chamber is set to fall within a range of room temperature to 200 degrees C., in some embodiments, room temperature to 150 degrees C., and in some other embodiments, room temperature to 100 degrees C.

(Supplementary Note 18)

According to another aspect of the present disclosure, there are provided a method of manufacturing a semiconductor device and a method of processing a substrate, including: performing a process of forming a carbon-containing film on a substrate in a process chamber; and cleaning an interior of the process chamber after performing the process of forming the carbon-containing film; wherein the act of cleaning the interior of the process chamber includes performing a cycle a predetermined number of times, the cycle including: supplying a modifying gas into the process chamber to modify deposits including the carbon-containing film deposited on a surface of a member in the process chamber; and supplying an etching gas into the process chamber to remove the modified deposits through a thermochemical reaction.

(Supplementary Note 19)

According to still another aspect of the present disclosure, there is provided a substrate processing apparatus, including: a process chamber configured to perform a process of forming a carbon-containing film on a substrate; a modifying gas supply system configured to supply a modifying gas into the process chamber; an etching gas supply system configured to supply an etching gas into the process chamber; and a control unit configured to control, in the event of cleaning an interior of the process chamber after performing the process of forming the carbon-containing film on the substrate in the process chamber, the modifying gas supply system and the etching gas supply system to perform a cycle a predetermined number of times, the cycle including: supplying the modifying gas into the process chamber to modify deposits including the carbon-containing film deposited on a surface of a member in the process chamber; and supplying the etching gas into the process chamber to remove the modified deposits through a thermochemical reaction.

(Supplementary Note 20)

According to still another aspect of the present disclosure, there is provided a non-transitory computer-readable recording medium storing a program that causes a computer to perform a process of cleaning an interior of a process chamber after performing a process of forming a carbon-containing film on a substrate in the process chamber, by performing a cycle a predetermined number of times, the cycle including: supplying a modifying gas into the process chamber to modify deposits including the carbon-containing film deposited on a surface of a member in the process chamber and supplying an etching gas into the process chamber to remove the modified deposits through a thermochemical reaction.

According to a cleaning method, a method of manufacturing a semiconductor device, a substrate processing apparatus and a recording medium of the present disclosure, it is possible to effectively remove deposits including a carbon-containing film deposited in a process chamber.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for cleaning an interior of a process chamber, the method comprising:
    performing a set a first predetermined number of times, wherein an iteration of the set includes:
        supplying a precursor gas and a first catalytic gas to a substrate in the process chamber, wherein the precursor gas contains silicon, carbon and a hydrogen element, and the precursor gas has an Si—C bonding,
        supplying an oxidizing gas and a second catalytic gas to the substrate to form an oxide film containing carbon; and
    performing a cycle a second predetermined number of times, wherein an iteration of the cycle comprises:
        supplying a modifying gas into the process chamber to modify deposits including the oxide film containing carbon; and
        supplying an etching gas into the process chamber to remove the modified deposits through a thermochemical reaction.

2. The method of claim 1, wherein, in the act of supplying the modifying gas, at least a portion of carbon contained in the deposits is desorbed from the deposits, and
    in the act of supplying the etching gas, the deposits from which at least the portion of the carbon is desorbed is removed through the thermochemical reaction.

3. The method of claim 1, wherein, in the act of supplying the modifying gas, the deposits are not removed, and at least a portion of carbon included in the deposits is desorbed from the deposits.

4. The method of claim 1, wherein the act of supplying the modifying gas is performed by supplying the modifying gas excited to a plasma state, and
    the act of supplying the etching gas is performed under a non-plasma atmosphere.

5. The method of claim 1, wherein, in the act of supplying the modifying gas, the deposits are modified through a plasma chemical reaction.

6. The method of claim 1, wherein the oxide film containing carbon is a film having an oxide film as a main agent, and at least a portion of oxygen in the oxide film is substituted with carbon.

7. The method of claim 1, wherein
    in the act of supplying the modifying gas, the oxide film containing the carbon included in the deposits is modified into an oxide film without containing carbon or an oxide film containing carbon having carbon concentration lower than that of the oxide film containing the carbon included in the deposits.

8. The method of claim 1, wherein the precursor gas contains at least one selected from the group consisting of an alkyl group and an alkylene group.

9. The method of claim 1, wherein the precursor gas contains at least one selected from the group consisting of an Si—C—Si bonding and an Si—C—C—Si bonding.

10. The method of claim 1, wherein each of the first catalytic gas and second catalytic gas each comprises at least one selected from the group consisting of an amine-based catalytic gas and a non-amine-based catalytic gas.

11. The method of claim 1, wherein the oxide film containing carbon is formed by setting a temperature of the substrate to fall within a range from room temperature to 200 degrees C.

12. The method of claim 1, wherein the oxide film containing carbon is obtained by thermal treatment.

13. The method of claim 1, wherein the modifying gas comprises at least one selected from the group consisting of an oxygen-containing gas, a hydrogen-containing gas and an inert gas, and
    the etching gas comprises a fluorine-containing gas.

14. The method of claim 1, wherein the modifying gas comprises at least one selected from the group consisting of an $O_2$ gas, a CO gas, a $CO_2$ gas, an NO gas, an $N_2O$ gas, an $O_3$ gas, an $H_2O_2$ gas, an $H_2$ gas, a $D_2$ gas, an $NH_3$ gas, an $N_2$ gas, an Ar gas, a He gas, a Ne gas and a Xe gas, and
    the etching gas comprises at least one selected from the group consisting of an HF gas, an F2 gas, an $NF_3$ gas and a $ClF_3$ gas.

15. A method of manufacturing a semiconductor device, comprising:
    performing a process of forming an oxide film containing carbon; wherein the act of forming an oxide film containing carbon comprises:
    performing a set a first predetermined number of times, an iteration of the set including:
        supplying a precursor gas containing silicon, carbon and a halogen element and having an Si—C bonding, and a first catalytic gas to a substrate in a process chamber; and
        supplying an oxidizing gas and a second catalytic gas to the substrate to form an oxide film containing carbon; and
    cleaning an interior of the process chamber wherein the act of cleaning the interior of the process chamber comprises performing a cycle a second predetermined number of times, an iteration of the cycle comprising:
        supplying a modifying gas into the process chamber to modify deposits including the oxide film containing carbon; and
        supplying an etching gas into the process chamber to remove the modified deposits through a thermochemical reaction.

16. A non-transitory computer-readable recording medium storing a program that causes a computer to perform a process of cleaning an interior of a process chamber, wherein the process comprises:
    performing a set a first predetermined number of times, one iteration of the set including:
        supplying a precursor gas containing silicon, carbon, and a halogen element and having an Si—C bonding, and a first catalytic gas to a substrate in the process chamber; and
        supplying an oxidizing gas and a second catalytic gas to the substrate to form an oxide film containing carbon; and
    performing a cycle a second predetermined number of times, one iteration of the cycle comprising:

supplying a modifying gas into the process chamber to modify deposits including the oxide film containing carbon; and supplying an etching gas into the process chamber to remove the modified deposits through a thermo-chemical reaction.

\* \* \* \* \*